United States Patent
Oikawa et al.

(10) Patent No.: US 9,459,528 B2
(45) Date of Patent: Oct. 4, 2016

(54) NEGATIVE TONE RESIST COMPOSITION FOR SOLVENT DEVELOPING AND METHOD OF FORMING RESIST PATTERN

(71) Applicant: Tokyo Ohka Kogyo Co., Ltd., Kawasak-shi (JP)

(72) Inventors: Tomohiro Oikawa, Kawasaki (JP); Rikita Tsunoda, Kawasaki (JP); Yusuke Suzuki, Kawasaki (JP); Jiro Yokoya, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/299,468

(22) Filed: Jun. 9, 2014

(65) Prior Publication Data
US 2014/0363770 A1  Dec. 11, 2014

(30) Foreign Application Priority Data
Jun. 10, 2013  (JP) ................. 2013-122142

(51) Int. Cl.
G03F 7/038  (2006.01)
G03F 7/004  (2006.01)

(52) U.S. Cl.
CPC ............. *G03F 7/038* (2013.01); *G03F 7/0045* (2013.01); *G03F 7/0048* (2013.01)

(58) Field of Classification Search
None
See application file for complete search history.

(56) References Cited

U.S. PATENT DOCUMENTS

| | | | |
|---|---|---|---|
| 2010/0069590 A1* | 3/2010 | Utsumi | C07C 69/653 526/245 |
| 2011/0262864 A1* | 10/2011 | Hirano et al. | 430/285.1 |
| 2012/0082936 A1* | 4/2012 | Serizawa et al. | 430/285.1 |
| 2012/0214101 A1* | 8/2012 | Shimizu et al. | 430/285.1 |
| 2012/0264058 A1* | 10/2012 | Utsumi et al. | 430/285.1 |
| 2013/0157197 A1* | 6/2013 | Komuro et al. | 430/285.1 |
| 2013/0189619 A1* | 7/2013 | Komuro et al. | 430/270.1 |
| 2013/0230804 A1* | 9/2013 | Sakakibara | C08F 220/10 430/285.1 |
| 2014/0186767 A1* | 7/2014 | Thackeray et al. | 430/281.1 |

FOREIGN PATENT DOCUMENTS

| | | | |
|---|---|---|---|
| JP | 2007-233322 | * | 9/2007 |
| JP | A-2009-025723 | | 2/2009 |
| JP | 2012-098390 | * | 5/2012 |
| JP | 2013-068821 | * | 4/2013 |
| JP | 2013-080109 | * | 5/2013 |
| WO | 2012/053527 | * | 4/2012 |
| WO | 2012/023349 | * | 2/2014 |

* cited by examiner

*Primary Examiner* — Martin Angebranndt
(74) *Attorney, Agent, or Firm* — Knobbe Martens Olson & Bear LLP

(57) ABSTRACT

A negative tone resist composition for solvent developing including: a base component (A) which exhibits decreased solubility in an organic solvent under the action of acid; a photodecomposable quencher (D0) which generates acid having a pKa of 2.0 or more; and a fluorine additive (F) containing a fluorine-containing polymeric compound (f) which has a structural unit (f0-1) represented by general formula (f0-1) shown below or a structural unit (f0-2) represented by general formula (f0-2) shown below. In the formulae, R represents a hydrogen atom, an alkyl group of 1 to 5 carbon atoms or a halogenated alkyl group of 1 to 5 carbon atoms; and $R_f^1$ represents an aliphatic hydrocarbon group containing a fluorine atom.

[Chemical Formula 1]

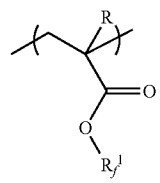

(f0-1)

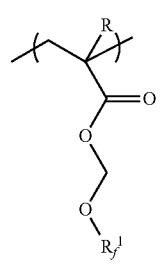

(f0-2)

6 Claims, No Drawings

NEGATIVE TONE RESIST COMPOSITION FOR SOLVENT DEVELOPING AND METHOD OF FORMING RESIST PATTERN

TECHNICAL FIELD

The present invention relates to a negative tone resist composition for solvent developing and a method of forming a resist pattern. Priority is claimed on Japanese Patent Application No. 2013-122142 filed on Jun. 10, 2013, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have led to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production of the semiconductor elements. Furthermore, research is also being conducted into lithography techniques that use an exposure light source having a wavelength shorter (energy higher) than these excimer lasers, such as electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified resist composition is used, which includes a base material component that exhibits a changed solubility in a developing solution under the action of acid and an acid generator component that generates acid upon exposure. For example, in the case where the developing solution is an alkali developing solution (alkali developing process), a chemically amplified positive resist which contains, as a base component (base resin), a resin which exhibits increased solubility in an alkali developing solution under action of acid, and an acid generator is typically used. If the resist film formed using the resist composition is selectively exposed during formation of a resist pattern, then within the exposed portions, acid is generated from the acid generator component, and the action of this acid causes an increase in the polarity of the base resin, making the exposed portions soluble in the alkali developing solution. Thus, by conducting alkali developing, the unexposed portions remain to form a positive resist pattern. On the other hand, in the case where such a resist composition is applied to a solvent developing process using a developing solution containing an organic solvent (organic developing solution), the polarity of the base resin at exposed portions is increased, whereas the solubility at exposed portions in an organic developing solution is relatively decreased. As a result, the unexposed portions of the resist film are dissolved and removed by the organic developing solution, and a negative resist pattern in which the exposed portions are remaining is formed. Such a solvent developing process for forming a negative-tone resist composition is sometimes referred to as "negative-tone developing process" (for example, see Patent Document 1).

DOCUMENTS OF RELATED ART

Patent Document

[Patent Document 1] Japanese Unexamined Patent Application, First Publication No. 2009-025723

SUMMARY OF THE INVENTION

As further progress is made in lithography techniques and miniaturization of resist patterns, further improvement in resist materials has been demanded in terms of various lithography properties.

The present invention takes the above circumstances into consideration, with an object of providing a resist composition which exhibits excellent lithography properties such as film retentiveness of a resist film, and a method of forming a resist pattern using the resist composition.

A first aspect of the present invention is a negative tone resist composition for solvent developing including: a base component (A) which exhibits decreased solubility in an organic solvent under the action of acid; a photodecomposable quencher (D0) which generates acid having a pKa of 2.0 or more; and a fluorine additive (F) containing a fluorine-containing polymeric compound (f) which has a structural unit (f0-1) represented by general formula (f0-1) shown below or a structural unit (f0-2) represented by general formula (f0-2) shown below.

[Chemical Formula 1]

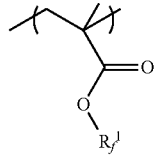
(f0-1)

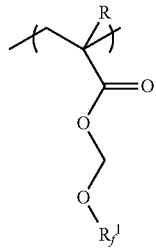
(f0-2)

In the formulae, R represents a hydrogen atom, an alkyl group of 1 to 5 carbon atoms or a halogenated alkyl group of 1 to 5 carbon atoms; and $R_f^1$ represents an aliphatic hydrocarbon group containing a fluorine atom.

In the first aspect of the present invention, the base component (A) preferably contains a polymeric compound (A1) which has a structural unit (a1) containing an acid decomposable group that exhibits increased polarity by the action of acid.

In the first aspect of the present invention, the negative tone resist composition for solvent developing may further include an acid generator component (B) which generates acid upon exposure.

In the first aspect of the present invention, as the photodecomposable quencher (D0), a compound represented by general formula (d0-1) or (d0-2) shown below is preferable.

[Chemical Formula 2]

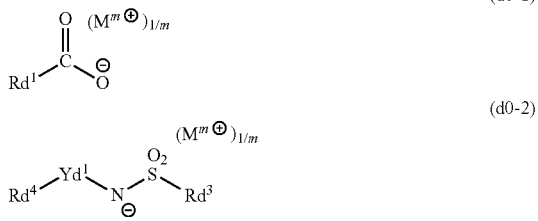

In the formulae, $Rd^1$, $Rd^3$ and $Rd^4$ each independently represents a cyclic group which may have a substituent, a chain-like alkyl group which may have a substituent (provided that, $Rd^1$ is not a perfluoroalkyl group) or a chain-like alkenyl group which may have a substituent, $Yd^1$ represents a single bond or a divalent linking group; m represents an integer of 1 or more; and $M^{m+}$ each independently represents an organic cation having a valency of m.

In the first aspect of the present invention, the fluorine-containing polymeric compound (f) preferably has a structural unit (a1) containing an acid decomposable group that exhibits increased polarity by the action of acid.

A second aspect of the present invention is a method of forming a resist pattern, including: using a negative tone resist composition for solvent developing of the first aspect to form a resist film on a substrate; conducting exposure of the resist film; and developing the resist film using an organic developing solution to form a negative resist pattern.

According to the present invention, there are provided a resist composition which exhibits excellent lithography properties such as film retentiveness of a resist film, and a method of forming a resist pattern using the resist composition.

MODE FOR CARRYING OUT THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with fluorine atom(s).

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent ($R^α$) that substitutes the hydrogen atom bonded to the carbon atom on the α-position is an atom other than hydrogen or a group, and examples thereof include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

The term "styrene" includes styrene itself and compounds in which the hydrogen atom at the α-position of styrene has been substituted with another substituent such as an alkyl group or a halogenated alkyl group.

A "structural unit derived from styrene or a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

The expression "may have a substituent" means that a case where a hydrogen atom (—H) is substituted with a monovalent group, or a case where a methylene (—CH$_2$—) group is substituted with a divalent group.

The term "exposure" is used as a general concept that includes irradiation with any form of radiation.

An "organic group" refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

<<Resist Composition>>

A negative tone resist composition for solvent developing of the first aspect of the present invention includes: a base component (A) which exhibits decreased solubility in an organic solvent under the action of acid; a photodecomposable quencher (D0) which generates acid having a pKa of 2.0 or more; and a fluorine additive (F) containing a fluorine-containing polymeric compound (f) which has a structural unit (f0-1) represented by general formula (f0-1) or a structural unit (f0-2) represented by general formula (f0-2).

In the resist composition, when radial rays are irradiated (when exposure is conducted), at exposed portions, the solubility of the component (A) in an organic solvent is decreased by the action of acid. Therefore, in the formation of a resist pattern, by conducting selective exposure of a resist film formed by using the resist composition, the solubility of the resist film at the exposed portions in a developing solution containing an organic solvent is decreased, whereas the solubility at the unexposed portions in an organic developing solution is unchanged, and hence, a resist pattern can be formed by removing the unexposed portions by negative tone development using an organic developing solution.

<Base Component: Component (A)>

In the present invention, the term "base component" refers to an organic compound capable of forming a film.

As the base component, an organic compound having a molecular weight of 500 or more is used. When the organic compound has a molecular weight of 500 or more, the organic compound exhibits a satisfactory film-forming ability, and a resist pattern of nano level can be easily formed.

The "organic compound having a molecular weight of 500 or more" is broadly classified into non-polymers and polymers.

In general, as a non-polymer, any of those which have a molecular weight in the range of 500 to less than 4,000 is used. Hereafter, a "low molecular weight compound" refers to a non-polymer having a molecular weight in the range of 500 to less than 4,000.

As a polymer, any of those which have a molecular weight of 1,000 or more is generally used. In the present description and claims, the term "polymeric compound" refers to a polymer having a molecular weight of 1,000 or more.

With respect to a polymeric compound, the "molecular weight" is the weight average molecular weight in terms of the polystyrene equivalent value determined by gel permeation chromatography (GPC).

As the component (A), a resin, a low molecular weight compound, or a combination thereof may be used.

The component (A) may be a component that exhibits increased solubility in a developing solution under action of acid or a component that exhibits decreased solubility in a developing solution under action of acid.

In the present invention, the component (A) may be a component that generates acid upon exposure.

The negative tone resist composition for solvent developing of the first aspect of the present invention preferably include a polymeric compound (A1) which has a structural unit (a1) containing an acid decomposable group that exhibits increased polarity by the action of acid.

(Structural Unit (a1))

The structural unit (a1) is a structural unit containing an acid decomposable group that exhibits increased polarity by the action of acid.

The term "acid decomposable group" refers to a group in which at least a part of the bond within the structure thereof is cleaved by the action of an acid.

Examples of acid decomposable groups which exhibit increased polarity by the action of an acid include groups which are decomposed by the action of acid to form a polar group.

Examples of the polar group include a carboxy group, a hydroxy group, an amino group and a sulfo group (—SO$_3$H). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

Here, the "acid dissociable group" is (i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity. As a result, the polarity of the entire component (A1) is increased. By the increase in the polarity, the solubility in a developing solution changes and, the solubility in an organic developing solution is relatively decreased.

The acid dissociable group is not particularly limited, and any of the groups that have been conventionally proposed as acid dissociable groups for the base resins of chemically amplified resists can be used.

Examples of the acid dissociable group for protecting the carboxy group or hydroxy group as a polar group include the acid dissociable group represented by general formula (a1-r-1) shown below (hereafter, sometimes referred to as "acetal-type acid dissociable group").

[Chemical Formula 3]

(a1-r-1)

In the formula, $Ra'^1$ and $Ra'^2$ each independently represents a hydrogen atom or an alkyl group; and $Ra'^3$ represents a hydrocarbon group, provided that $Ra'^3$ may be bonded to $Ra'^1$ or $Ra'^2$ to form a ring.

In the formula (a1-r-1), as the alkyl group for $Ra'^1$ and $Ra'^2$, the same alkyl groups as those described above for the alkyl groups as the substituent which may be bonded to the carbon atom on the α-position of the aforementioned α-substituted alkylester can be used, although a methyl group or ethyl group is preferable, and a methyl group is particularly desirable.

As the hydrocarbon group for $Ra'^3$, an alkyl group of 1 to 20 carbon atoms is preferable, an alkyl group of 1 to 10 carbon atoms is more preferable, and a linear or branched alkyl group is still more preferable. Specific examples thereof include a methyl group, an ethyl group, a propyl group, an isopropyl group, an n-butyl group, an isobutyl group, a tert-butyl group, a pentyl group, an isopentyl group, a neopentyl group, 1,1-dimethylethyl group, 1,1-diethylpropyl group, 2,2-dimethylpropyl group and 2,2-dimethylbutyl group.

When $Ra'^3$ is a cyclic hydrocarbon group, the hydrocarbon group may be either an aliphatic group or an aromatic group, and may be either a polycyclic group or a monocyclic group. As the monocyclic alicyclic hydrocarbon group, a group in which one hydrogen atom has been removed from a monocycloalkane is preferable. The monocycloalkane preferably has 3 to 8 carbon atoms, and specific examples thereof include cyclopentane, cyclohexane and cyclooctane. As the polycyclic alicyclic hydrocarbon group, a group in which one hydrogen atom has been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which one hydrogen atom has been removed from the aforementioned aromatic hydrocarbon ring (aryl group); and a group in which one hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atoms, more preferably 1 or 2, and most preferably 1.

In the case where $Ra'^3$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Examples of the acid dissociable group for protecting the carboxy group as a polar group include the acid dissociable group represented by general formula (a1-r-2) shown below (hereafter, with respect to the acid dissociable group represented by the following formula (a1-r-2), the acid dissociable group constituted of alkyl groups is referred to as "tertiary ester-type acid dissociable group").

[Chemical Formula 4]

(a1-r-2)

In the formula, $Ra'^4$ to $Ra'^6$ each independently represents a hydrocarbon group, provided that $Ra'^5$ and $Ra'^6$ may be mutually bonded to form a ring.

As the hydrocarbon group for $Ra'^4$ to $Ra'^6$, the same groups as those described above for $Ra'^3$ can be mentioned. $Ra'^4$ is preferably an alkyl group of 1 to 5 carbon atoms. In the case where $Ra'^5$ and $Ra'^6$ are mutually bonded to form a ring, a group represented by general formula (a1-r2-1) shown below can be mentioned.

On the other hand, in the case where $Ra'^4$ to $Ra'^6$ are not mutually bonded and independently represent a hydrocarbon group, the group represented by general formula (a1-r2-2) shown below can be mentioned.

[Chemical Formula 5]

(a1-r2-1)

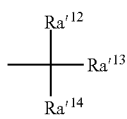
(a1-r2-2)

In the formulae, $Ra'^{10}$ represents an alkyl group of 1 to 10 carbon atoms; $Ra'^{11}$ is a group which forms an aliphatic cyclic group together with a carbon atom having $Ra'^{10}$ bonded thereto; and $Ra'^{12}$ to $Ra'^{14}$ each independently represents a hydrocarbon group.

In the formula (a1-r2-1), as the alkyl group of 1 to 10 carbon atoms for $Ra'^{10}$, the same groups as described above for the linear or branched alkyl group for $Ra'^{3}$ in the formula (a1-r-1) are preferable. In the formula (a1-r2-1), as the aliphatic cyclic group which is formed by $Ra'^{11}$, the same groups as those described above for the cyclic alkyl group for $Ra'^{3}$ in the formula (a1-r-1) are preferable.

In the formula (a1-r-2), it is preferable that $Ra'^{12}$ and $Ra'^{14}$ each independently represents an alkyl group or 1 to 10 carbon atoms, and it is more preferable that the alkyl group is the same group as described above for the linear or branched alkyl group for $Ra'^{3}$ in the formula (a1-r-1), it is still more preferable that the alkyl group is a linear alkyl group of 1 to 5 carbon atoms, and it is particularly preferable that the alkyl group is a methyl group or an ethyl group.

In the formula (a1-r-2), it is preferable that $Ra'^{13}$ is the same group as described above for the linear, branched or cyclic alkyl group for $Ra'^{3}$ in the formula (a1-r-1).

Among these, the same cyclic alkyl group as those describe above for $Ra'^{3}$ is more preferable.

Specific examples of the formula (a1-r2-1) are shown below. The "*" in the formula represents a valence bond.

[Chemical Formula 6]

(r-pr-m1)

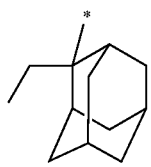
(r-pr-m2)

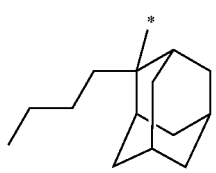
(r-pr-m3)

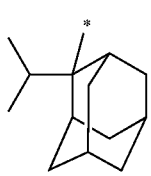
(r-pr-m4)

(r-pr-m5)

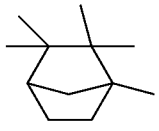
(r-pr-m6)

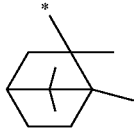
(r-pr-m7)

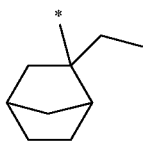
(r-pr-m8)

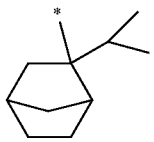
(r-pr-m9)

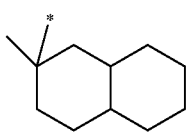
(r-pr-m10)

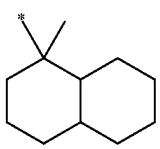
(r-pr-m11)

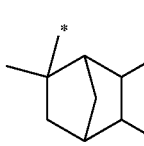
(r-pr-m12)

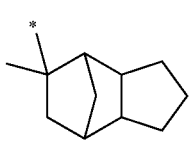
(r-pr-m13)

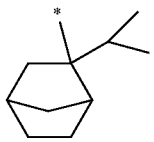
(r-pr-m14)

-continued
(r-pr-m15)
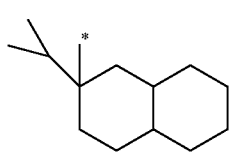
(r-pr-m16)
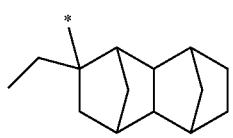
(r-pr-m17)
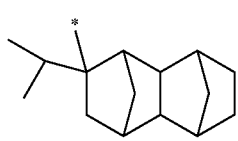
(r-pr-s1)
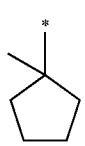
(r-pr-s2)
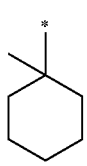
(r-pr-s3)
(r-pr-s4)
(r-pr-s5)
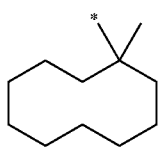
(r-pr-s6)
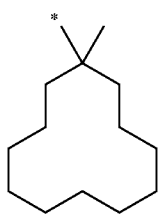
(r-pr-s7)
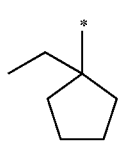
-continued
(r-pr-s8)
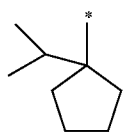
(r-pr-s9)
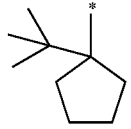
(r-pr-s10)
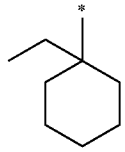
(r-pr-s11)
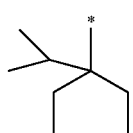
(r-pr-s12)
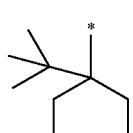
(r-pr-s13)
(r-pr-s14)
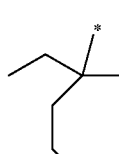
(r-pr-s15)
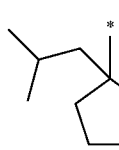
(r-pr-s16)
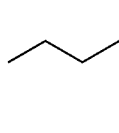
(r-pr-s17)
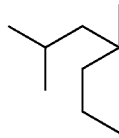

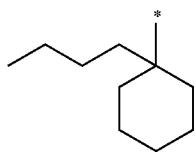 (r-pr-s18)
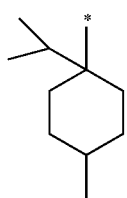 (r-pr-s19)
Specific examples of the formula (a1-r2-2) are shown below.
[Chemical Formula 7]
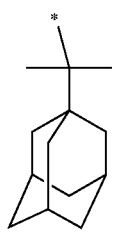 (r-pr-cm1)
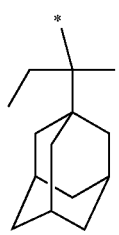 (r-pr-cm2)
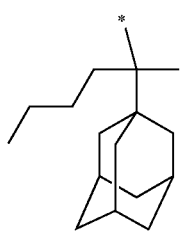 (r-pr-cm3)
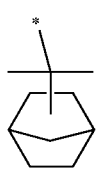 (r-pr-cm4)
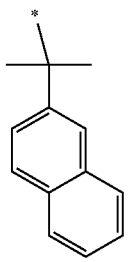 (r-pr-cm5)
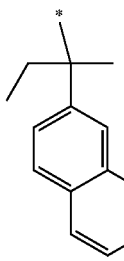 (r-pr-cm6)
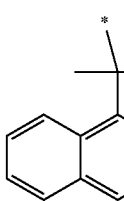 (r-pr-cm7)
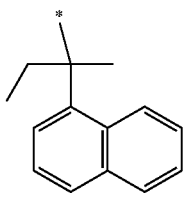 (r-pr-cm8)
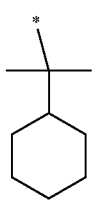 (r-pr-cs1)
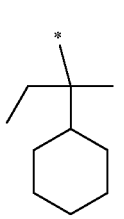 (r-pr-cs2)
 (r-pr-cs3)

-continued (r-pr-cs4)
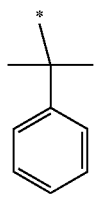

(r-pr-cs5)
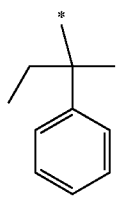

(r-pr-c1)

(r-pr-c2)
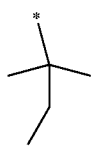

(r-pr-c3)
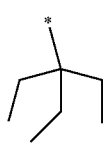

(r-pr-c4)
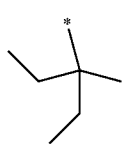

(r-pr-c5)
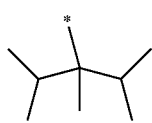

Examples of the acid dissociable group for protecting a hydroxy group as a polar group include the acid dissociable group represented by general formula (a1-r-3) shown below (hereafter, referred to as "tertiary alkyloxycarbonyl-type acid dissociable group").

[Chemical Formula 8]

(a1-r-3)
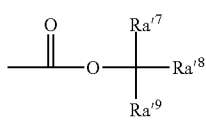

In the formula, $Ra'^7$ to $Ra'^9$ each independently represents an alkyl group.

In the formula (a1-r-3), it is preferable that $Ra'^7$ to $Ra'^9$ each independently represents an alkyl group of 1 to 5 carbon atoms, and it is more preferable that $Ra'^7$ to $Ra'^9$ each independently represents an alkyl group of 1 to 3 carbon atoms.

Further, the total number of carbon atoms within the alkyl group is preferably 3 to 7, more preferably 3 to 5, and most preferably 3 or 4.

Examples of the structural unit (a1) include a structural unit derived from an acrylate ester which may have the hydrogen atom bonded to the carbon atom on the α-position substituted with a substituent and contains an acid decomposable group which exhibits increased polarity by the action of acid; a structural unit derived from hydroxystyrene or a hydroxystyrene derivative in which at least a part of the hydrogen atom of the hydroxy group is protected with a substituent containing an acid decomposable group; and a structural unit derived from vinylbenzoic acid or a vinylbenzoic acid derivative in which at least a part of the hydrogen atom within —C(=O)—OH is protected with a substituent containing an acid decomposable group.

As the structural unit (a1), a structural unit derived from an acrylate ester which may have the hydrogen atom bonded to the carbon atom on the α-position substituted with a substituent is preferable.

As the structural unit (a1), structural units represented by general formulae (a1-1) to (a1-3) shown below are preferable, and two or more types of the structural units may be used in combination.

[Chemical Formula 9]

(a1-1)
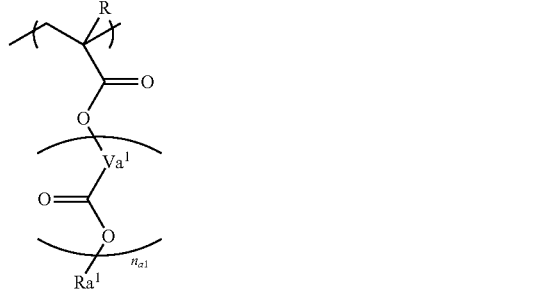

(a1-2)
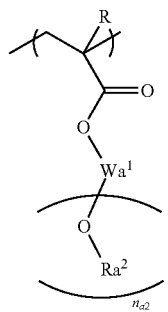

-continued

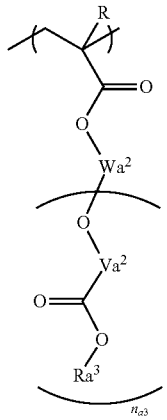

(a1-3)

In the formulae, R represents a hydrogen atom, an alkyl group of 1 to 5 carbon atoms or a halogenated alkyl group of 1 to 5 carbon atoms; $Va^1$ represents a divalent linking group which may contain a linking group selected from the group consisting of an ether bond, an urethane bond and an amide bond; $n_{a1}$ represents an integer of 0 to 2;

$Ra^1$ represents an acid dissociable group represented by the aforementioned formulae (a1-r-1) or (a1-r-2);

$Wa^1$ represents a hydrocarbon group having a valency of $n_{a2}+1$; $n_{a2}$ represents 1 to 3;

$Ra^2$ represents an acid dissociable group represented by the aforementioned formulae (a1-r-1) or (a1-r-3);

$Wa^1$ represents a hydrocarbon group having a valency of $n_{a3}+1$; $n_{a3}$ represents 1 to 3;

$Va^2$ represents a divalent hydrocarbon group which may contain an ether bond, an urethane bond or an amide bond; and $Ra^3$ represents an acid dissociable group represented by the aforementioned formulae (a1-r-1) or (a1-r-2).

In the aforementioned formula (a1-1), the hydrocarbon group for $Va^1$ may be either an aliphatic hydrocarbon group or an aromatic hydrocarbon group. An "aliphatic hydrocarbon group" refers to a hydrocarbon group that has no aromaticity. The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Further, as the group for $Va^1$, a group in which the aforementioned divalent hydrocarbon group has been bonded via an ether bond, urethane bond or amide bond can be mentioned.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable, and specific examples include a methylene group [—$CH_2$—], an ethylene group [—$(CH_2)_2$—], a trimethylene group [—$(CH_2)_3$—], a tetramethylene group [—$(CH_2)_4$-] and a pentamethylene group [—$(CH_2)$—].

As the branched aliphatic hydrocarbon group, a branched alkylene group is preferable, and specific examples include alkylalkylene groups, e.g., alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

As examples of the aliphatic hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed within a linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic alicyclic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic alicyclic hydrocarbon group, a group in which two hydrogen atoms have been removed from a polycycloalkane is preferable, and the polycycloalkane preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic hydrocarbon group as the divalent hydrocarbon group for $Va^1$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic cyclic group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (for example, a group in which one hydrogen atom has been removed from an aryl group within an arylalkyl group such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atoms, more preferably 1 or 2, and most preferably 1.

In the aforementioned formula (a1-2), the hydrocarbon group for $Wa^1$ having a valency of $n_{a2}+1$ may be either an aliphatic hydrocarbon group or an aromatic hydrocarbon group. The aliphatic hydrocarbon group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for $Va^1$ in the aforementioned formula (a1-1) can be mentioned.

The valency of $n_{a2}+1$ is preferably divalent, trivalent or tetravalent, and divalent or trivalent is more preferable.

In the aforementioned formula (a1-3), the hydrocarbon group for $Wa^1$ having a valency of $n_{a3}+1$ may be either an aliphatic hydrocarbon group or an aromatic hydrocarbon group. The aliphatic hydrocarbon group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for $Va^1$ in the aforementioned formula (a1-1) can be mentioned.

The valency of $n_{a3}+1$ is preferably divalent, trivalent or tetravalent, and divalent or trivalent is more preferable.

In the formula (a1-3), $Va^2$ is the same group as defined above for $Va^1$ in the formula (a1-1).

As the structural unit represented by the aforementioned formula (a1-2), a structural unit represented by general formula (a1-r-01) shown below is desirable.

[Chemical Formula 10]

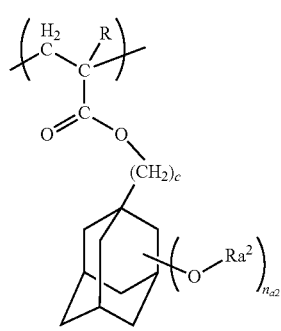

(a1-2-01)

In the formula (a1-2-01), $Ra^2$ represents an acid dissociable group represented by the aforementioned formulae (a1-r-1) or (a1-r-3); $n_{a1}$ is an integer of 1 to 3, preferably 1 or 2, and more preferably 1; c is an integer of 0 to 3, preferably 0 or 1, and more preferably 1; and R is the same as defined above.

Specific examples of the structural units (a1-1) and (a1-2) are shown below. In the formulae shown below, $R^\alpha$ represents a hydrogen atom, a methyl group or a trifluoromethyl group.

[Chemical Formula 11]

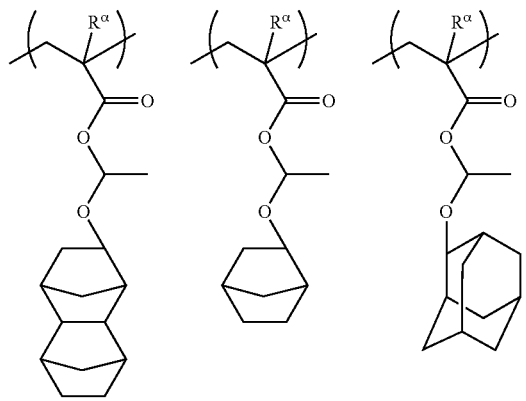

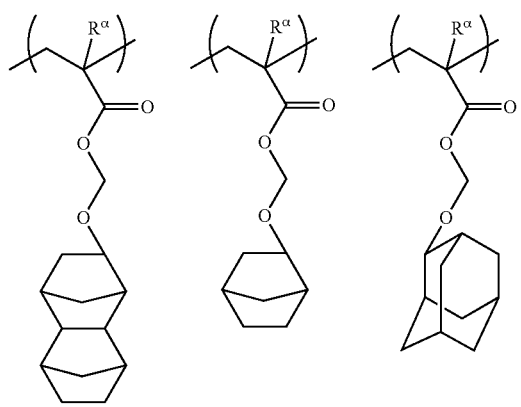

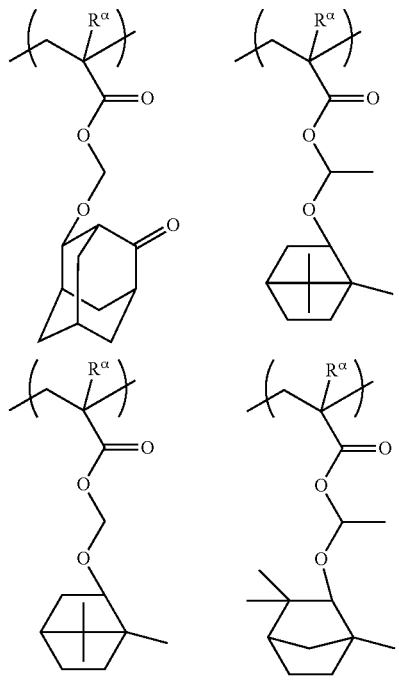

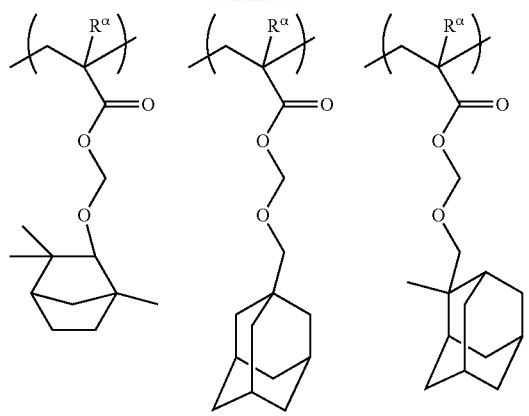
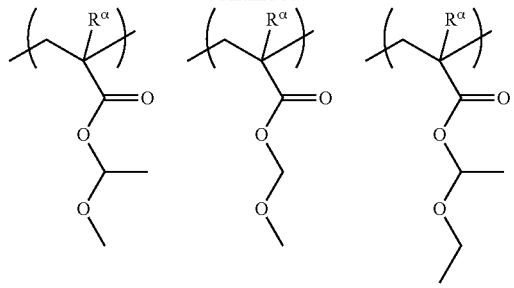
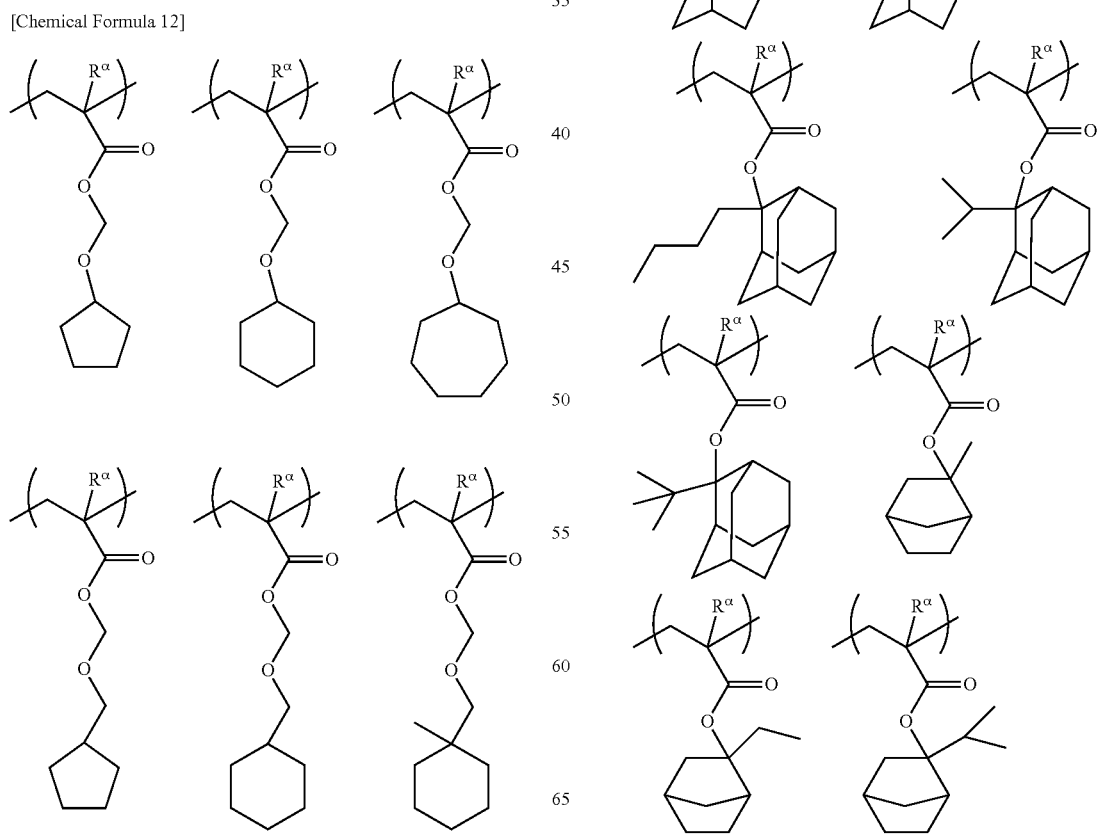
[Chemical Formula 12]
[Chemical Formula 13]

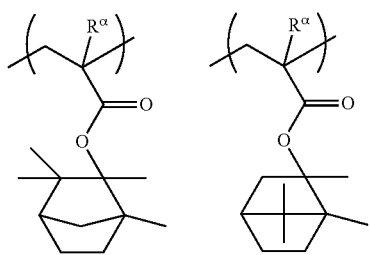
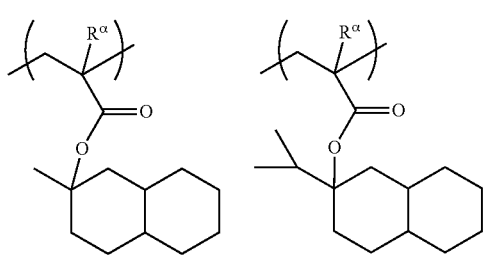
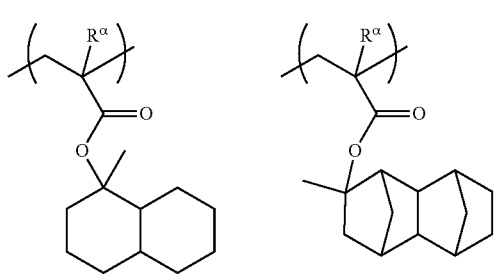
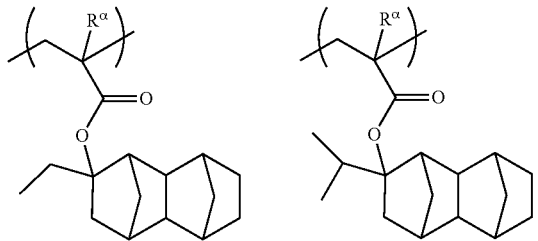
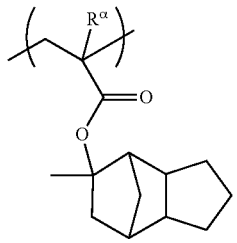
[Chemistry Formula 14]
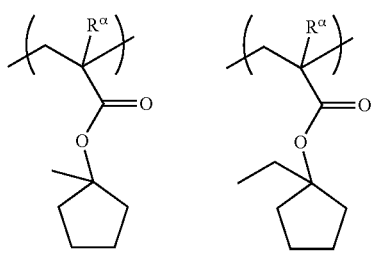
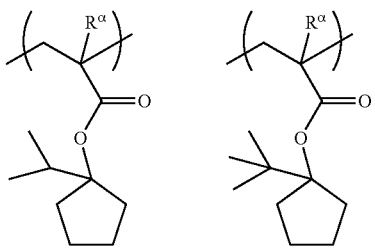
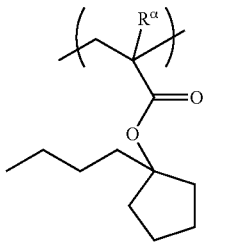
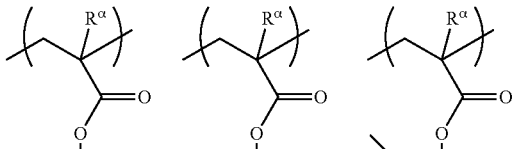
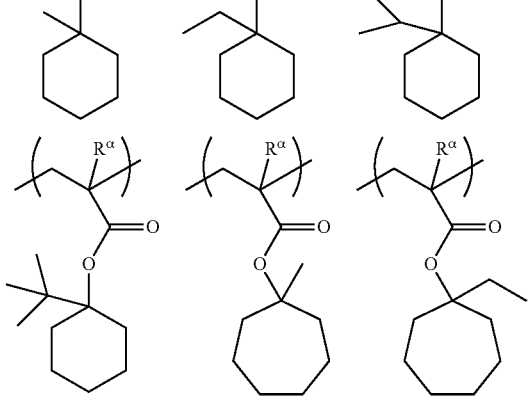
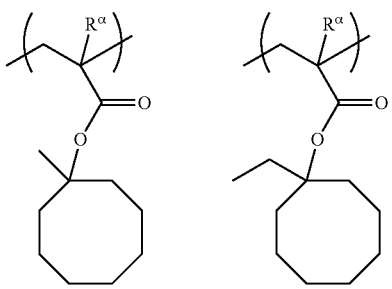
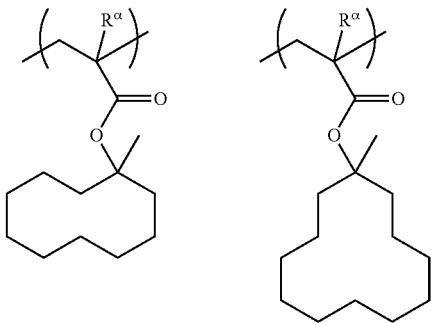

[Chemical Formula 15]

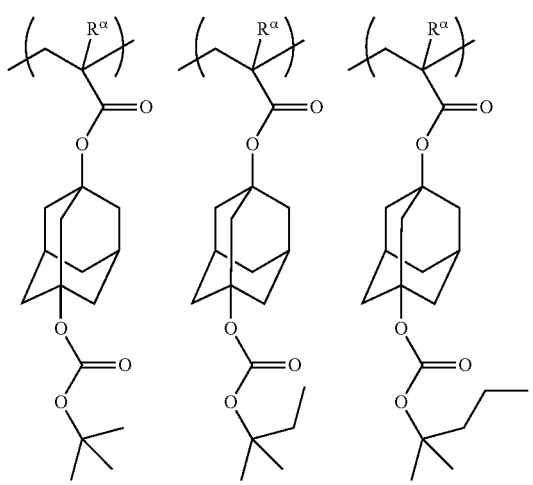

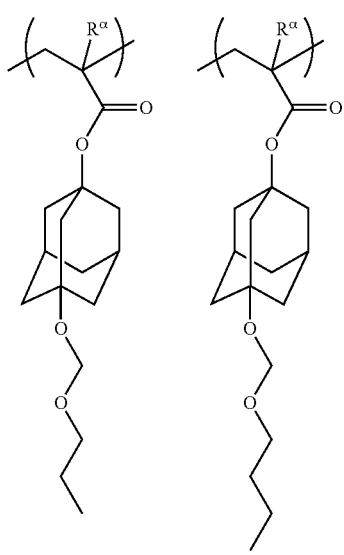

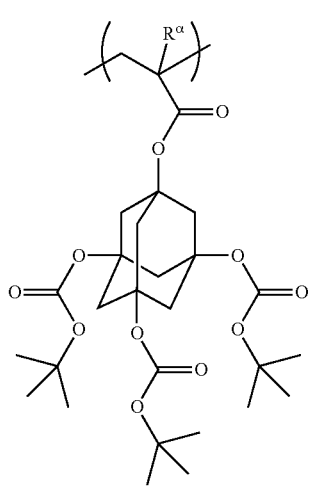

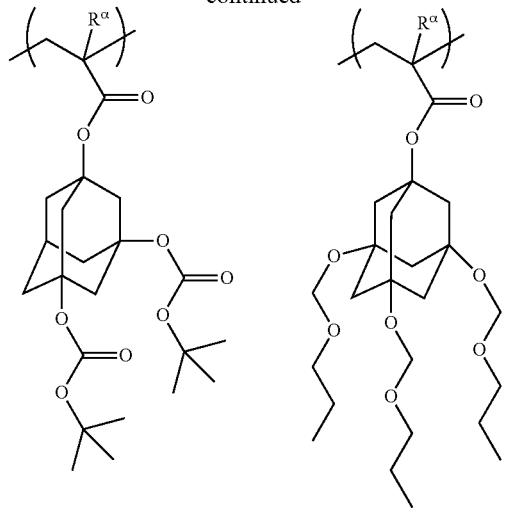

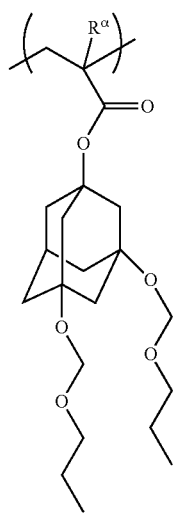

In the component (A), the amount of the structural unit (a1) based on the combined total of all structural units constituting the component (A) is preferably 20 to 80 mol %, more preferably 20 to 75 mol %, and still more preferably 25 to 70 mol %. When the amount of the structural unit (a1) is at least as large as the lower limit of the above-mentioned range, various lithography properties such as sensitivity, resolution and LWR are improved. On the other hand, when the amount of the structural unit (a1) is no more than the upper limit of the above-mentioned range, a good balance can be achieved with the other structural units.

The negative tone resist composition for solvent developing according to the first aspect of the present invention preferably includes structural units (a2) to (a5) described later, as well as the structural unit (a1).

(Structural Unit (a2))

The structural unit (a2) is a structural unit containing a lactone-containing cyclic group.

When the component (A1) is used for forming a resist film, the lactone-containing cyclic group within the structural unit (a2) is effective in improving the adhesion between the resist film and the substrate.

The aforementioned structural unit (a1) which contains a lactone-containing cyclic group falls under the definition of the structural unit (a2); however, such a structural unit is regarded as a structural unit (a1), and does not fall under the definition of the structural unit (a2).

The structural unit (a2) is preferably a structural unit represented by general formula (a2-1) shown below.

[Chemical Formula 16]

(a-2-1)

In the formula, R represents a hydrogen atom, an alkyl group of 1 to 5 carbon atoms or a halogenated alkyl group of 1 to 5 carbon atoms; $Ya^{21}$ represents a single bond or a divalent linking group; $La^{21}$ represents —O—, —COO—, —CON(R')—, —COO—, —CONHCO— or —CONHCS; and R' represents a hydrogen atom or a methyl group, provided that when $La^{21}$ represents —O—, $Ya^{21}$ does not represents —CO—; and $Ra^{21}$ represents a lactone-containing cyclic group.

The divalent linking group for $Ya^{21}$ is not particularly limited, and preferable examples thereof include a divalent hydrocarbon group which may have a substituent and a divalent linking group containing a hetero atom.

(Divalent Hydrocarbon Group which May have a Substituent)

The hydrocarbon group as a divalent linking group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof can be given. Specific examples thereof include the same group as exemplified above for $Va^1$ in the aforementioned formula (a1-1).

The linear or branched aliphatic hydrocarbon group may or may not have a substituent. Examples of the substituent include a fluorine atom, a fluorinated alkyl group of 1 to 5 carbon atoms, and a carbonyl group.

As examples of the aliphatic hydrocarbon group containing a ring in the structure thereof, a cyclic aliphatic hydrocarbon group which may have a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed within a linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

Specific examples of the cyclic aliphatic hydrocarbon group include the same group as exemplified above for $Va^1$ in the aforementioned formula (a1-1).

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is most desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

In the cyclic aliphatic hydrocarbon group, part of the carbon atoms constituting the ring structure thereof may be substituted with a substituent containing a hetero atom. The substituent containing a hetero atom is preferably —O—, —C(=O)—O—, —S—, —S(=O)$_2$—, or —S(=O)$_2$—O—

Specific examples of the aromatic hydrocarbon group as a divalent hydrocarbon group include the same group as exemplified above for $Va^1$ in the aforementioned formula (a1-1).

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is most desirable.

As the alkoxy group, the halogen atom and the halogenated alkyl group for the substituent, the same groups as the aforementioned substituent groups for substituting a hydrogen atom within the cyclic aliphatic hydrocarbon group can be used.

(Divalent Linking Group Containing a Hetero Atom)

With respect to a divalent linking group containing a hetero atom, a hetero atom is an atom other than carbon and hydrogen, and examples thereof include an oxygen atom, a nitrogen atom, a sulfur atom and a halogen atom.

In the case where $Ya^{21}$ represents a divalent linking group containing a hetero atom, preferable examples of the linking group include —O—, —C(=O)—O—, —C(=O)—, —O—C(=O)—O—, —C(=O)—NH—, —NH— and —NH—C(=NH)— (wherein H may be substituted with a substituent such as an alkyl group or an acyl group), —S—, —S(=O)$_2$—, —S(=O)$_2$—O—, and a group represented by general formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m'}$—$Y^{22}$— or —$Y^{21}$—O—C(=O)—$Y^{22}$— [in the formulae, each of $Y^{21}$ and $Y^{22}$ independently represents a divalent hydrocarbon group which may have a substituent, 0 represents an oxygen atom, and m' represents an integer of 0 to 3].

When the divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formula $Y^{21}$—O—$Y^{22}$, —$Y^{21}$—O—, —$Y^{21}$—C(=O)—O—, —C(=O)—O—$Y^{21}$—, —[$Y^{21}$—C(=O)—O]$_{m'}$—$Y^{22}$— or —$Y^{21}$—O—C(=O)—$Y^{22}$—, $Y^{21}$ and $Y^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As $Y^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As $Y^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[$Y^{21}$—C(=O)—O]$_{m'}$—$Y^{22}$—, m' represents an integer of 0 to 3, preferably an integer of 0 to 2, more preferably 0 or 1, and particularly preferably 1. Namely, it is particularly desirable that the group represented by the formula —[$Y^{21}$—C(=O)—O]$_{m'}$—$Y^{22}$— is a group represented by the formula —$Y^{21}$—C(=O)—O—$Y^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In the present invention, Ya$^{21}$ preferably represents an ester bond [—C(=O)—O—], an ether bond (—O—), a linear or branched alkylene group, a combination of these, or a single bond.

In the formula (a2-1), Ra$^{21}$ represents a lactone-containing cyclic group.

The term "lactone-containing cyclic group" refers to a cyclic group including a ring containing a —O—C(=O)— structure (lactone ring) in the ring skeleton thereof. The term "lactone ring" refers to a single ring containing a —O—C(=O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

As the lactone-containing cyclic group, there is no particular limitation, and an arbitrary group may be used.

Specific examples include groups represented by general formulae (a1-r-1) to (a2-r-7) shown below. Hereafter, "*" represents a valence bond.

[Chemical Formula 17]

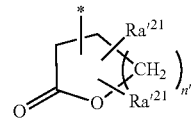

(a2-r-1)

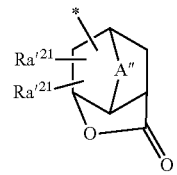

(a2-r-2)

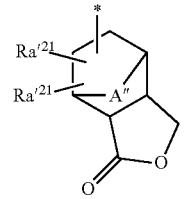

(a2-r-3)

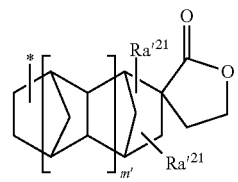

(a2-r-4)

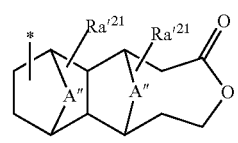

(a2-r-5)

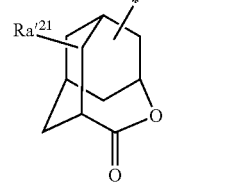

(a2-r-6)

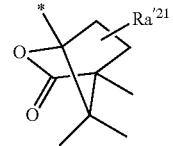

(a2-r-7)

In the formulae, each Ra'$^{21}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; n' represents an integer of 0 to 2; and m' represents 0 or 1.

In general formulae (a1-r-1) to (a2-r-7), A" represents an oxygen atom, a sulfonyl group or an alkylene group of 1 to 5 carbon atoms which may contain an oxygen atom (—O—) or a sulfur atom (—S—). As the alkylene group of 1 to 5 carbon atoms for A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—$CH_2$—, —$CH_2$—O—$CH_2$—, —S—$CH_2$— and —$CH_2$—S—$CH_2$—. As A", an alkylene group of 1 to 5 carbon atoms or —O— is preferable, more preferably an alkylene group of 1 to 5 carbon atoms, and most preferably a methylene group. As the alkyl group, alkoxy group, halogen atom, halogenated alkyl group, halogenated alkyl group, —COOR", —OC(=O)R" and hydroxyalkyl group for $Ra'^{21}$, the same alkyl groups, alkoxy groups, halogenated alkyl groups, —COOR", —OC(=O)R" and hydroxyalkyl groups as those described above as the substituent which the divalent cyclic group for $V_o^{a1}$ in the general formula (a0) may have can be used.

Specific examples of the groups represented by the aforementioned general formulae (a1-r-1) to (a2-r-7) are shown below.

[Chemical Formula 18]

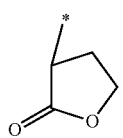
(r-lc-1-1)

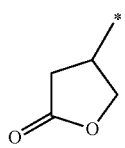
(r-lc-1-2)

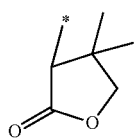
(r-lc-1-3)

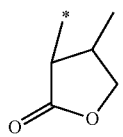
(r-lc-1-4)

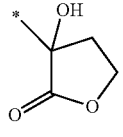
(r-lc-1-5)

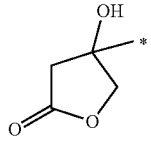
(r-lc-1-6)

-continued

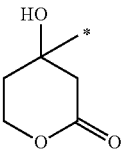
(r-lc-1-7)

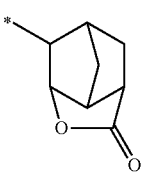
(r-lc-2-1)

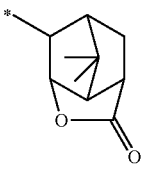
(r-lc-2-2)

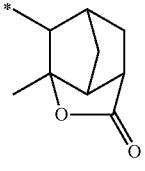
(r-lc-2-3)

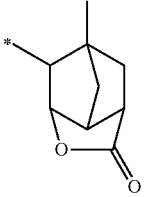
(r-lc-2-4)

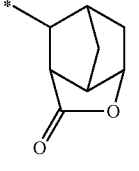
(r-lc-2-5)

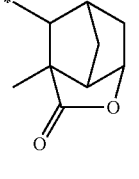
(r-lc-2-6)

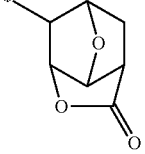
(r-lc-2-7)

-continued
(r-lc-2-8)
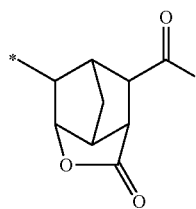
(r-lc-2-9)
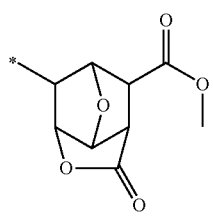
(r-lc-2-10)
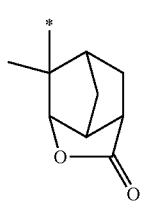
(r-lc-2-11)
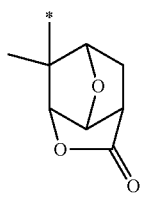
(r-lc-2-12)
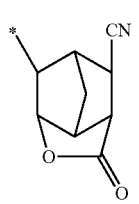
(r-lc-2-13)
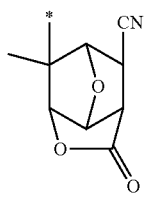
(r-lc-3-1)
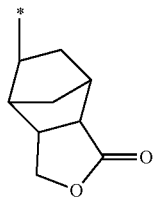
-continued
(r-lc-3-2)
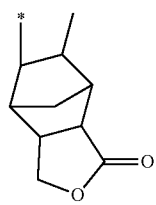
(r-lc-3-3)
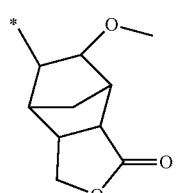
(r-lc-3-4)
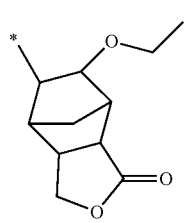
(r-lc-3-5)
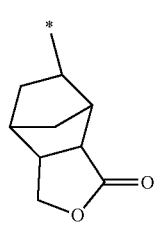
(r-lc-4-1)
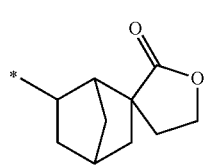
(r-lc-4-2)
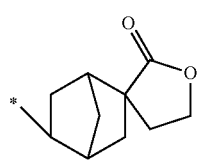
(r-lc-4-3)
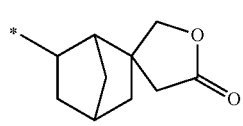
(r-lc-4-4)
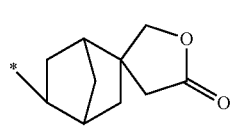
(r-lc-4-5)
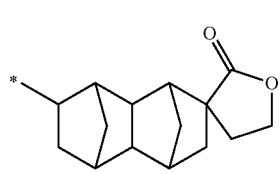

-continued

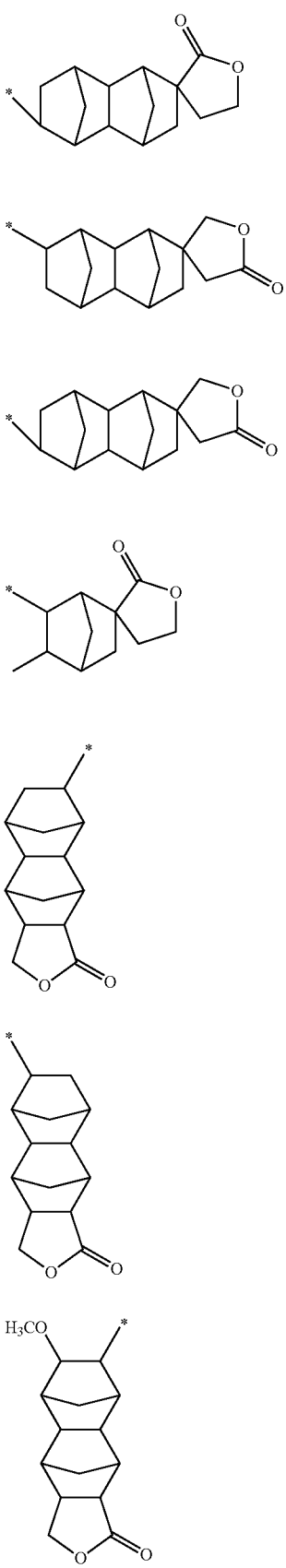

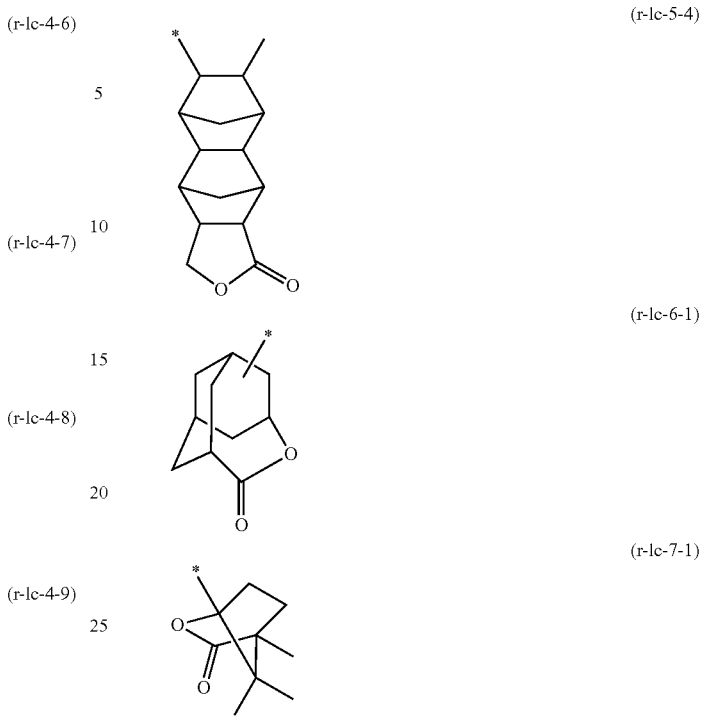

Among these, groups represented by the general formulae (a1-r-1) and (a2-r-2) are preferable, and groups represented by the general formulae (r-1c-1-1) to (r-1c-1-7) and (r-1c-2-1) to (r-1c-2-13) are more preferable.

As the structural unit (a2) contained in the component (A1), 1 type of structural unit may be used, or 2 or more types may be used.

When the component (A1) contains the structural unit (a2), the amount of the structural unit (a2) based on the combined total of all structural units constituting the component (A1) is preferably 1 to 80 mol %, more preferably 5 to 70 mol %, still more preferably 10 to 65 mol %, and particularly preferably 10 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and various lithography properties such as DOF and CDU and pattern shape can be improved.

(Structural Unit (a3))

The structural unit (a3) is a structural unit containing a polar group-containing aliphatic hydrocarbon group (provided that the structural units that fall under the definition of structural units (a1) and (a2) are excluded).

When the component (A1) includes the structural unit (a3), it is presumed that the hydrophilicity of the component (A) is enhanced, thereby contributing to improvement in resolution. It is presumed that the solubility of the component (A) in a developing solution can be easily controlled, and sensitivity and shape of the resist pattern can be improved.

Examples of the polar group include a hydroxyl group, a cyano group, a carboxyl group, or a hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups may be either monocyclic or polycyclic, and can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that includes an aliphatic polycyclic group that contains a hydroxyl group, a cyano group, a carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, a group in which two or more hydrogen atoms have been removed from adamantane, a group in which two or more hydrogen atoms have been removed from norbornane or a group in which two or more hydrogen atoms have been removed from tetracyclododecane are preferred industrially.

As the structural unit (a3), there is no particular limitation as long as it is a structural unit containing a polar group-containing aliphatic hydrocarbon group, and an arbitrary structural unit may be used. The structural unit (a3) is preferably a structural unit derived from an acrylate ester which may have the hydrogen atom bonded to the carbon atom on the α-position substituted with a substituent and contains a polar group-containing aliphatic hydrocarbon group.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulae (a3-1), (a3-2) and (a3-3) shown below are preferable.

In terms of improving the sensitivity of the resist composition, it is preferable to include the structural unit represented by formula (a3-1). In terms of improving the shape of the resist pattern, it is preferable to include the structural unit represented by formula (a3-2) or the structural unit represented by formula (a3-3).

[Chemical Formula 19]

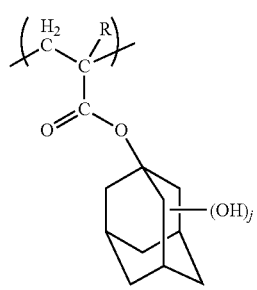

(a3-1)

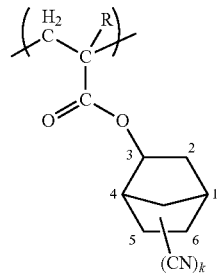

(a3-2)

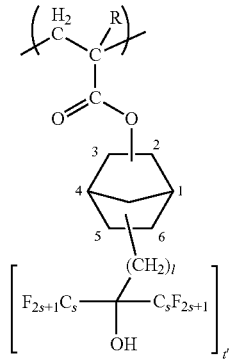

(a3-3)

In the formulae, R is as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 type of structural unit may be used, or 2 or more types may be used.

The amount of the structural unit (a3) within the component (A1) based on the combined total of all structural units constituting the component (A1) is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Structural Unit (a4))

The structural unit (a4) is a structural unit containing an acid non-dissociable cyclic group. When the component (A1) includes the structural unit (a4), dry etching resistance of the resist pattern to be formed are improved. Further, the hydrophobicity of the component (A1) is further improved. Increase in the hydrophobicity contributes to improvement in terms of resolution, shape of the resist pattern and the like, particularly in an organic solvent developing process.

In the structural unit (a4), an "acid non-dissociable, aliphatic cyclic group" refers to a cyclic group which is not dissociated by the action of the acid generated from the component (B) upon exposure, and remains in the structural unit.

As the structural unit (a4), a structural unit which contains a non-acid-dissociable aliphatic cyclic group, and is also derived from an acrylate ester is preferable. Examples of this cyclic group include the same groups as those described above in relation to the aforementioned structural unit (a1), and any of the multitude of conventional groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulae (a4-1) to (a4-7) shown below.

[Chemical Formula 20]

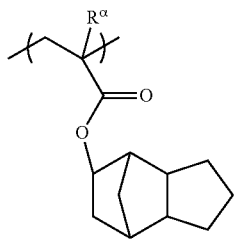

(a4-1)

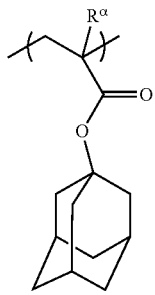

(a4-2)

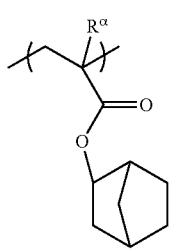

(a4-3)

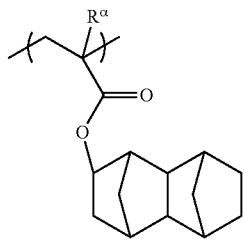

(a4-4)

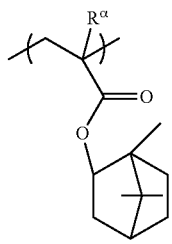

(a4-5)

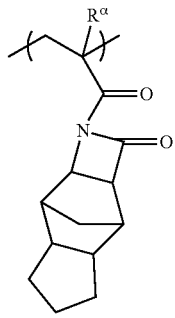

(a4-6)

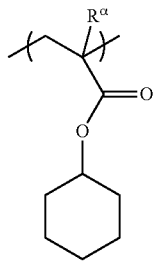

(a4-7)

In the formulae shown above, $R^\alpha$ represents a hydrogen atom, a methyl group or a trifluoromethyl group.

As the structural unit (a4) contained in the component (A1), 1 type of structural unit may be used, or 2 or more types may be used.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

(Structural Unit (a5))

The structural unit (a5) is a structural unit represented by the general formula (a2-1). In the formula (a2-1), $Ra^{21}$ represents a carbonate-containing cyclic group or an —$SO_2$— containing cyclic group.

An "—$SO_2$— containing cyclic group" refers to a cyclic group having a ring containing —$SO_2$— within the ring structure thereof, i.e., a cyclic group in which the sulfur atom (S) within —$SO_2$— forms part of the ring skeleton of the cyclic group. The ring containing —$SO_2$— within the ring skeleton thereof is counted as the first ring. A cyclic group in which the only ring structure is the ring that contains —$SO_2$— in the ring skeleton thereof is referred to as a monocyclic group, and a group containing other ring structures is described as a polycyclic group regardless of the structure of the other rings. The —$SO_2$— containing cyclic group may be either a monocyclic group or a polycyclic group.

As the —$SO_2$— containing cyclic group as a cyclic hydrocarbon group for $Ra^{21}$, a cyclic group containing —O—$SO_2$— within the ring skeleton thereof, i.e., a cyclic group containing a sultone ring in which —O—S— within the —O—$SO_2$— group forms part of the ring skeleton thereof is particularly desirable. More specific examples of the —$SO_2$— containing cyclic group include groups represented by general formulae (a5-r-1) to (a5-r-4) shown below.

[Chemical Formula 21]

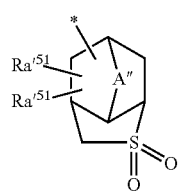

(a5-r-1)

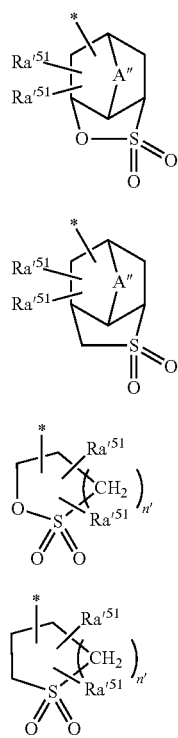

(a5-r-2)

(a5-r-3)

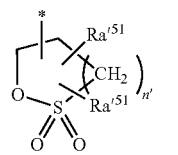

(a5-r-4)

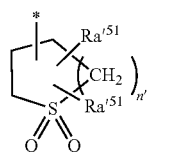

In the formulae, each $Ra'^{51}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and n' represents an integer of 0 to 2.

In general formulae (a5-r-1) to (a5-r-4), A" is the same as defined for A" in general formulae (a2-r-1) to (a2-r-7). Examples of the alkyl group, alkoxy group, halogen atom, halogenated alkyl group, —COOR", —OC(=O)R" and hydroxyalkyl group for $Ra'^{51}$ include the same groups as those described above in the explanation of $Ra'^{21}$ in the general formulae (a2-r-1) to (a2-r-7).

Specific examples of the groups represented by the aforementioned general formulae (a5-r-1) to (a5-r-4) are shown below. In the formulae shown below, "Ac" represents an acetyl group.

[Chemical Formula 22]

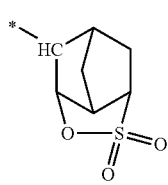

(r-sl-1-1)

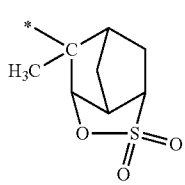

(r-sl-1-2)

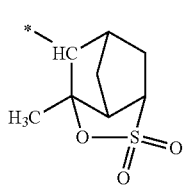

(r-sl-1-3)

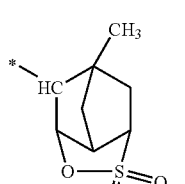

(r-sl-1-4)

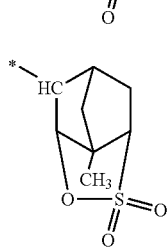

(r-sl-1-5)

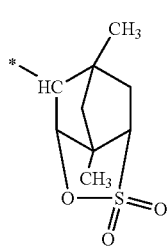

(r-sl-1-6)

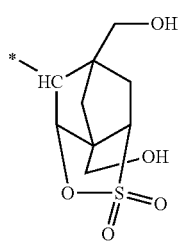

(r-sl-1-7)

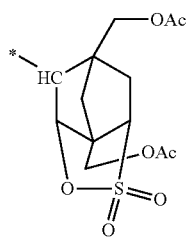 (r-sl-1-8)
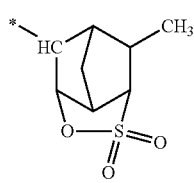 (r-sl-1-9)
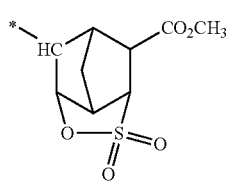 (r-sl-1-10)
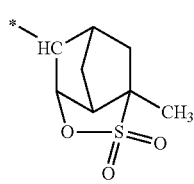 (r-sl-1-11)
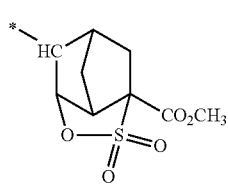 (r-sl-1-12)
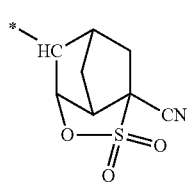 (r-sl-1-13)
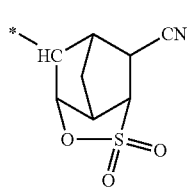 (r-sl-1-14)
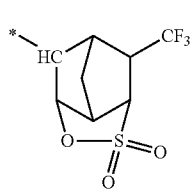 (r-sl-1-15)
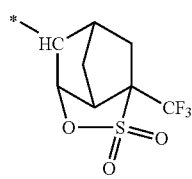 (r-sl-1-16)
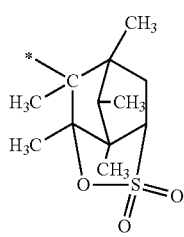 (r-sl-1-17)
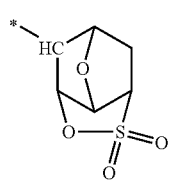 (r-sl-1-18)
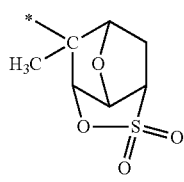 (r-sl-1-19)
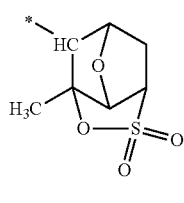 (r-sl-1-20)
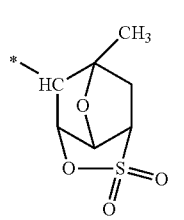 (r-sl-1-21)
[Chemical Formula 23]
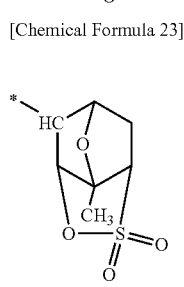 (r-sl-1-22)

(r-sl-1-23)
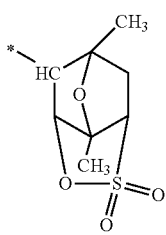

(r-sl-1-24)
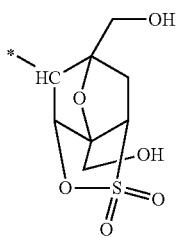

(r-sl-1-25)
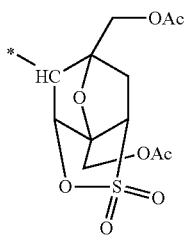

(r-sl-1-26)
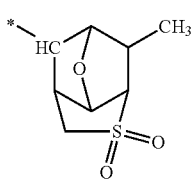

(r-sl-1-27)
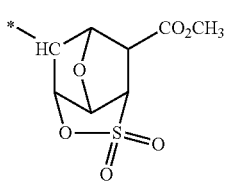

(r-sl-1-28)
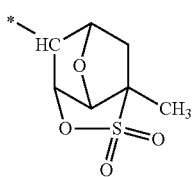

(r-sl-1-29)
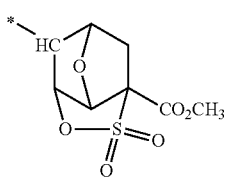

(r-sl-1-30)
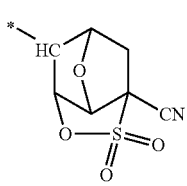

(r-sl-1-31)
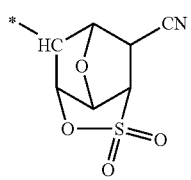

(r-sl-1-32)
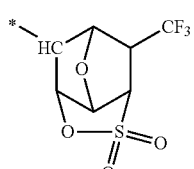

(r-sl-1-33)
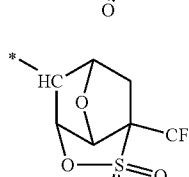

[Chemical Formula 24]

(r-sl-2-1)
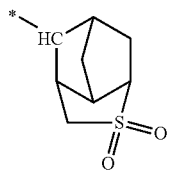

(r-sl-2-2)
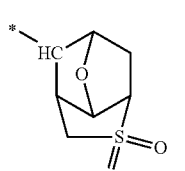

(r-sl-3-1)
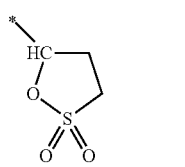

(r-sl-4-1)
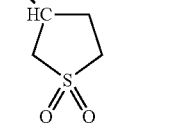

As the —$SO_2$— containing cyclic group, a group represented by the aforementioned general formula (a5-r-1) is preferable, at least one member selected from the group consisting of groups represented by the aforementioned chemical formulae (r-s1-1-1), (r-s1-1-18), (r-s1-3-1) and (r-s1-4-1) is more preferable, and a group represented by chemical formula (r-s1-1-1) is most preferable.

The term "carbonate-containing cyclic group" refers to a cyclic group including a ring containing a —O—C(═O)—O— structure (carbonate ring) in the ring skeleton thereof. The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group for Ra$^{21}$ as a cyclic hydrocarbon group is not particularly limited, and an arbitrary structural unit may be used. Specific examples include groups represented by general formulae (ax3-r-1) to (ax3-r-3) shown below.

[Chemical Formula 25]

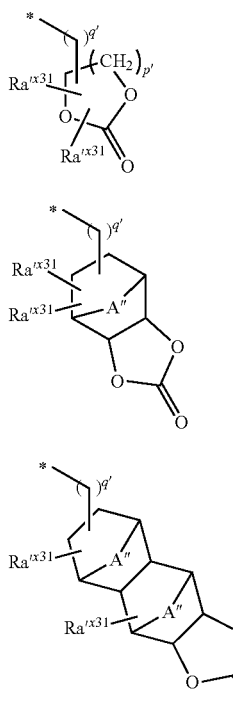

(ax3-r-1)

(ax3-r-2)

(ax3-r-3)

In the formulae, each Ra$'^{x31}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; p' represents an integer of 0 to 3; and q' represents 0 or 1.

In general formulae (ax3-r-1) to (ax3-r-3), A" is the same as defined for A" in general formula (a2-r-1).

Examples of the alkyl group, alkoxy group, halogen atom, halogenated alkyl group, —COOR", —OC(=O)R" and hydroxyalkyl group for Ra$'^{31}$ include the same groups as those described above in the explanation of Ra$'^{21}$ in the general formulae (a2-r-1) to (a2-r-7).

Specific examples of the groups represented by the aforementioned general formulae (ax3-r-1) to (ax3-r-3) are shown below.

[Chemical Formula 26]

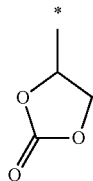

(r-cr-1-1)

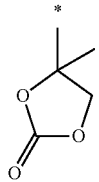

(r-cr-1-2)

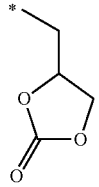

(r-cr-1-3)

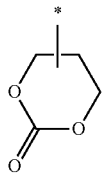

(r-cr-1-4)

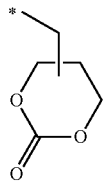

(r-cr-1-5)

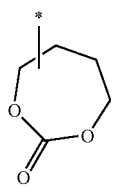

(r-cr-1-6)

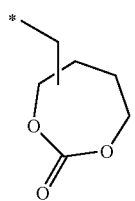

(r-cr-1-6)

-continued (r-cr-2-1)
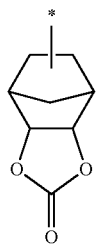

(r-cr-2-2)
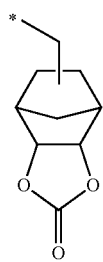

(r-cr-2-3)
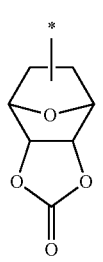

(r-cr-2-4)
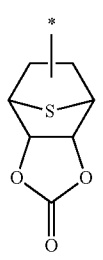

(r-cr-3-1)
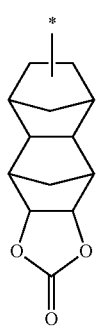

(r-cr-3-2)
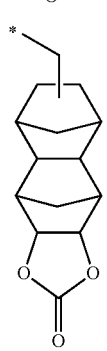

-continued (r-cr-3-3)

(r-cr-3-4)
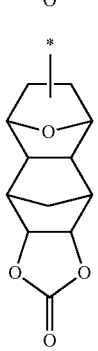

(r-cr-3-5)
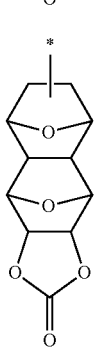

Among the examples shown above, an —SO$_2$— containing cyclic group is preferable, a group represented by the general formula (a5-r-1) is preferable, and a group represented by any one of the chemical formulae (r-s1-1-1) and (r-s1-1-18) is still more preferable.

As the structural unit (a5) contained in the component (A1), 1 type of structural unit may be used, or 2 or more types may be used.

When the component (A1) contains the structural unit (a5), the amount of the structural unit (a5) based on the combined total of all structural units constituting the component (A1) is preferably 1 to 80 mol %, more preferably 5 to 70 mol %, still more preferably 10 to 65 mol %, and particularly preferably 10 to 60 mol %. When the amount of the structural unit (a5) is at least as large as the lower limit of the above-mentioned range, the effect of using the structural unit (a5) can be satisfactorily achieved. On the other hand, when the amount of the structural unit (a5) is no more than the upper limit of the above-mentioned range, a good balance can be achieved with the other structural units, and various lithography properties such as DOF and CDU and pattern shape can be improved.

In the present invention, the component (A1) is preferably a polymeric compound containing the structural unit (a1), and preferably a polymeric compound containing one or more structural units selected from structural units (a2) and (a5). Specific examples of the polymeric compound include a polymeric compound consisting of a repeating structure of a structural unit (a1) and a structural unit (a2); a polymeric compound consisting of a repeating structure of a structural unit (a1), a structural unit (a2) and a structural unit (a5); and a polymeric compound consisting of a repeating structure of a structural unit (a1), a structural unit (a2), a structural unit (a3) and a structural unit (a5).

The weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000.

When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is not particularly limited, but is preferably 1.0 to 5.0, more preferably 1.0 to 3.0, and most preferably 1.0 to 2.5. Here, Mn is the number average molecular weight.

The component (A1) can be obtained, for example, by a conventional radical polymerization or the like of the monomers corresponding with each of the structural units, using a radical polymerization initiator such as azobisisobutyronitrile (AIBN) or dimethyl 2,2'-azobis(isobutyrate).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a polymeric compound having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

As the component (A1), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved.

In the negative tone resist composition for solvent developing, the amount of the component (A) can be appropriately adjusted depending on the thickness of the resist film to be formed, and the like.

<Photodecomposable Quencher>

The negative tone resist composition for solvent developing according to the first aspect of the present invention contains a photodecomposable quencher (D0) (hereafter, sometimes referred to as "component (D0)") which generates acid having a pKa of 2.0 or more. The photodecomposable quencher functions as an acid diffusion control agent, i.e., a quencher which traps the acid generated from a component (B) described later and the like upon exposure.

In the present invention, the component (D0) is decomposed upon exposure and then loses the ability of controlling of acid diffusion.

In the prevent invention, the component (D0) is not particularly limited as long as it has a pKa of 2.0 or more. The larger the pKa value, the higher contrast, and the resolution can be improved. In the present invention, pKa is 2.0 or more, and preferably 3.0 or more, and more preferably 3.5 or more. The upper limit is not particularly limited, and a counteranion which can generates acid having a pKa of about 10 can be mentioned.

In the present invention, it is presumed that, by using the component (D0) having a pKa within the aforementioned range, film retentiveness of a resist film can be improved.

In the present invention, as the photodecomposable quencher (D0), a compound represented by general formula (d0-1) or (d0-2) shown below is preferable.

[Chemical Formula 27]

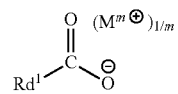

(d0-1)

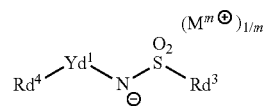

(d0-2)

In the formulae, $Rd^1$, $Rd^3$ and $Rd^4$ each independently represents a cyclic group which may have a substituent, a chain-like alkyl group which may have a substituent (provided that, $Rd^1$ is not a perfluoroalkyl group) or a chain-like alkenyl group which may have a substituent, $Yd^1$ represents a single bond or a divalent linking group; m represents an integer of 1 or more; and $M^{m+}$ each independently represents an organic cation having a valency of m.

In the formula (d0-1), $Rd^1$, $Rd^3$ and $Rd^4$ each independently represents a cyclic group which may have a substituent, a chain-like alkyl group which may have a substituent or a chain-like alkenyl group which may have a substituent, provided that, $Rd^1$ is not a perfluoroalkyl group; m represents an integer of 1 or more; and $M^{m+}$ each independently represents an organic cation having a valency of m.

[Cyclic Group which May have a Substituent]

In formula (d0-1), as the cyclic group which may have a substituent for $Rd^1$, the same groups as cyclic groups which may have a substituent defined above for $R^{101}$ in formula (b-1) described later.

As the aromatic hydrocarbon group as a cyclic group for $Rd^1$, among the aromatic hydrocarbon groups exemplified for $R^{101}$ in formula (b-1) described later, an aryl group is preferable, and a phenyl group is more preferable.

As the substituent which the cyclic group for $Rd^1$ may have, among the substituents exemplified as a substituent for $R^{101}$ in formula (b-1) described later, a hydroxy group is preferable.

When $Rd^1$ is an aromatic group which may have a substituent, by adjusting the substitution position of the aromatic group, it is possible to control the pKa value.

As the aliphatic hydrocarbon group as a cyclic group for $Rd^1$, groups in which one hydrogen atom has been removed from either a monocycloalkane or a polycycloalkane exemplified above in the explanation of the divalent aliphatic hydrocarbon group for $Va^1$ in the formula (a1-1) can be mentioned, and an adamantyl group or a norbornyl group is preferable.

When $Rd^1$ is an aliphatic hydrocarbon group which may have a substituent, by adjusting the introducing position of the electron-withdrawing groups, it is possible to control the pKa value.

[Chain-Like Alkyl Group which May have a Substituent]

In formula (d0-1), as the chain-like alkyl group which may have a substituent for $Rd^1$, the same groups as chain-like alkyl groups which may have a substituent defined above for $R^{101}$ in formula (b-1) described later, provided that, $Rd^1$ is not a perfluoroalkyl group. In particular, a group represented by formula (d0-1-1) shown below is preferable.

[Chemical Formula 28]

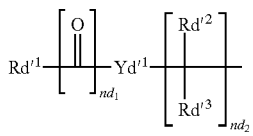

(d0-1-1)

In the formula, $Rd'^1$ represents a hydrogen atom, a hydroxy group, a halogen atom, an alkyl group, a halogenated alkyl group, an alkoxy group or a cyclic group which may have a substituent; $Yd'^1$ represents a single bond, an oxygen atom or a sulfur atom; $Rd'^2$ and $Rd'^3$ each independently represents a hydrogen atom or a chain-like alkyl group which may have a substituent; $nd_1$ represents 0 or 1; and $nd_2$ represents an integer of 1 to 10.

In the formula (d0-1-1), $Rd'^1$ represents a hydrogen atom, a hydroxy group, a halogen atom, an alkyl group, a halogenated alkyl group, an alkoxy group or a cyclic group which may have a substituent.

As the alkyl group, an alkyl group of 1 to 5 carbon atoms is preferable, and a methyl group, an ethyl group, a propyl group, an n-butyl group or a tert-butyl group is more preferable.

Examples of the halogen atom include a fluorine atom, a chlorine atom, a bromine atom and an iodine atom.

Example of the halogenated alkyl group includes a group in which a part or all of the hydrogen atoms within an alkyl group of 1 to 5 carbon atoms such as a methyl group, an ethyl group, a propyl group, an n-butyl group or a tert-butyl group have been substituted with the aforementioned halogen atoms.

As the alkoxy group, an alkoxy group of 1 to 5 carbon atoms is preferable, and examples thereof include a methoxy group, an ethoxy group, an n-propoxy group, an iso-propoxy group, an n-butoxy group and a tert-butoxy group.

As the cyclic group which may have a substituent, the same as those for $Rd^1$ can be mentioned.

In the formula (d0-1-1), $Yd'^1$ represents a single bond, an oxygen atom or a sulfur atom.

In the formula (d0-1-1), $Rd'^2$ and $Rd'^3$ each independently represents a hydrogen atom or a chain-like alkyl group which may have a substituent. $nd_1$ represents 0 or 1, and $nd_2$ represents an integer of 1 to 10.

[Chain-Like Alkenyl Group which May have a Substituent]

In formula (d0-1), as the chain-like alkenyl group which may have a substituent for $Rd^1$, the same groups as chain-like alkenyl groups which may have a substituent defined above for $R^{101}$ in formula (b-1) described later.

Specific examples of the anion moiety of the compound represented by formula (d0-1) are shown below.

[Chemical Formula 29]

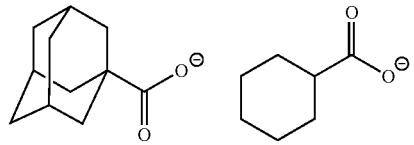

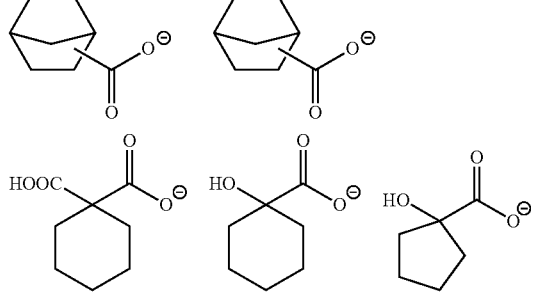

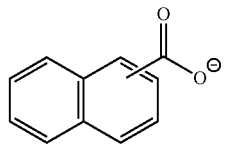

[Chemical Formula 30]

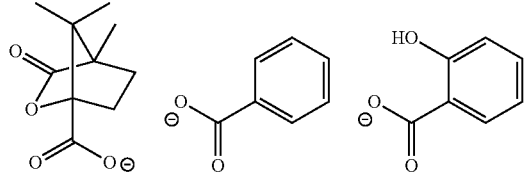

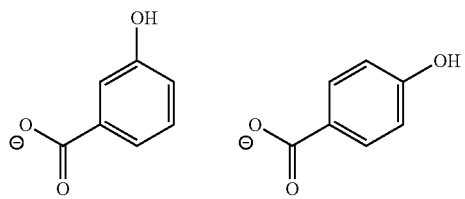

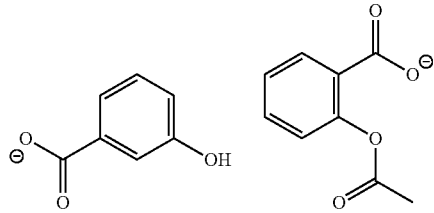

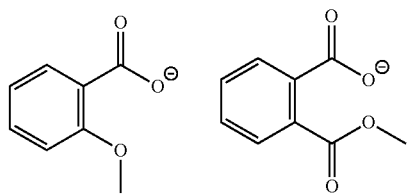

-continued

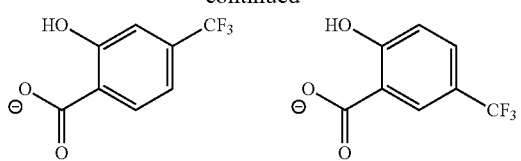

[Chemical Formula 31]

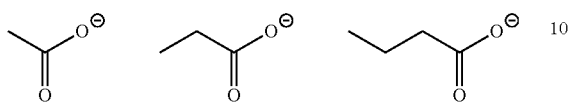

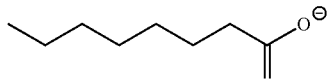

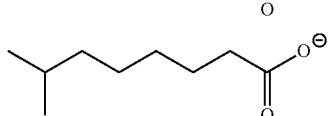

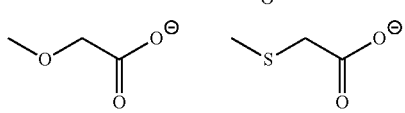

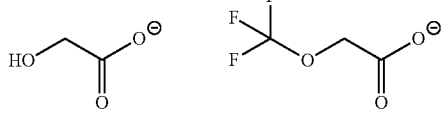

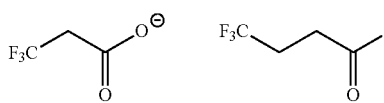

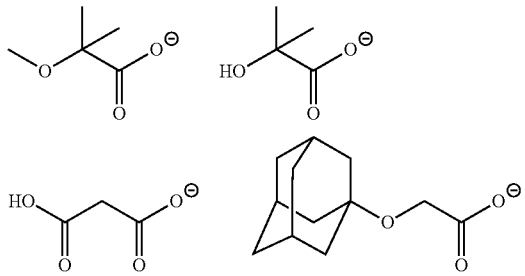

[Chemical Formula 32]

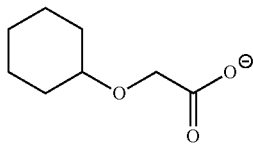

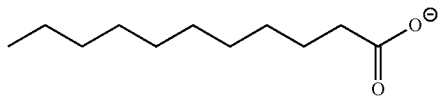

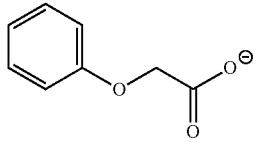

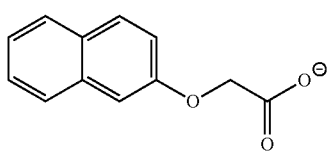

-continued

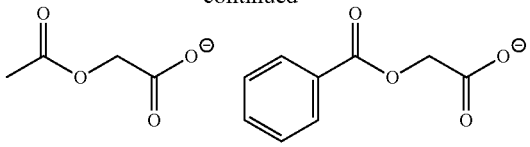

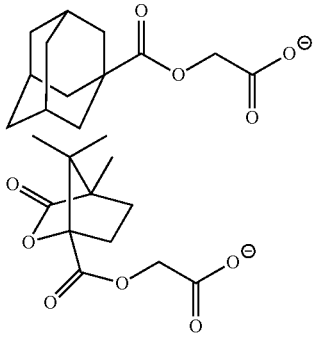

In the formula (d0-1), m represents an integer of 1 or more; and $M^{m+}$ each independently represents an organic cation having a valency of m.

Further, as examples of the organic cation having a valency of m, the same cations as those for $M^{m+}$ in general formulae (b-1) to (b-3) described later can also be given.

In the formula (d0-2), $Rd^3$ and $Rd^4$ represents a cyclic group which may have a substituent, a chain-like alkyl group which may have a substituent or a chain-like alkenyl group which may have a substituent; $Yd^1$ represents a single bond or a divalent linking group; m represents an integer of 1 or more; and $M^{m+}$ each independently represents an organic cation having a valency of m.

In the formula (d0-2), as the cyclic group which may have a substituent, the chain-like alkyl group which may have a substituent and the chain-like alkenyl group which may have a substituent for $Rd^3$ and $Rd^4$, the same cyclic group which may have a substituent, chain-like alkyl group which may have a substituent and chain-like alkenyl group which may have a substituent as those for $R^{101}$ in general formula (b-1) described later can be mentioned.

In formula (d0-2), $Yd^1$ represents a single bond or a divalent linking group.

As examples of the divalent linking group for $Yd^1$, the same groups as divalent linking groups described above for $Ya^{21}$ in formula (a2-1) can be given.

In the formula (d0-2), m represents an integer of 1 or more; and $M^{m+}$ each independently represents an organic cation having a valency of m.

Further, as examples of the organic cation having a valency of m, the same cations as those for $M^{m+}$ in general formulae (b-1) to (b-3) described later can also be given.

Specific examples of the anion moiety of the compound represented by formula (d0-2) are shown below.

[Chemical Formula 33]

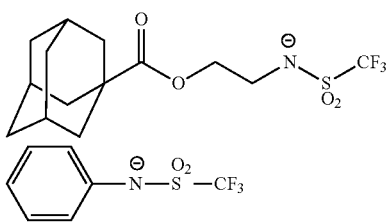

-continued

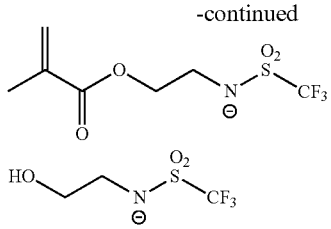

The pKa values and the structure of anion moieties of the preferable compounds as the component (D0) in the present invention are shown in following Tables 1 and 2.

TABLE 1

| No. | Anion moiety | pKa |
|---|---|---|
| 1 | 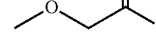 | 3.55 ± 0.1 |
| 2 | 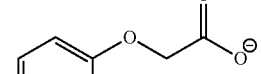 | 3.17 ± 0.1 |
| 3 |  | 3.18 ± 0.3 |
| 4 | 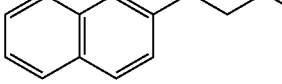 | 3.66 ± 0.1 |
| 5 |  | 2.42 ± 0.1 |
| 6 |  | 3.16 ± 0.1 |
| 7 |  | 2.69 ± 0.1 |

TABLE 2

| No. | Anion moiety | pKa |
|---|---|---|
| 8 |  | 2.67 ± 0.1 |
| 9 | 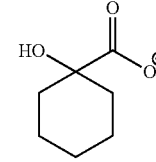 | 3.99 ± 0.2 |
| 10 | 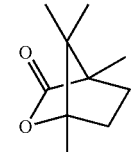 | 3.36 ± 0.6 |
| 11 | 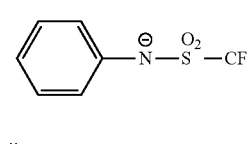 | 4.83 |
| 12 | 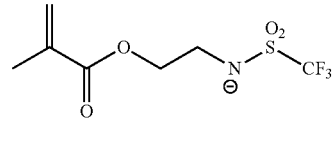 [SMILES: C=C(C)C(=O)OCC[N-]S(=O)(=O)C(F)(F)F] | 5.49 |
| 13 | 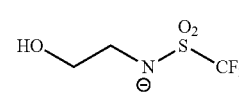 | 5.81 |

As the component (D0), one type of the compounds can be used, or at least two types can be used in combination.

The amount of the component (D0) relative to 100 parts by weight of the component (A) is preferably within a range from 0.5 to 10 parts by weight, more preferably from 0.5 to 8 parts by weight, and still more preferably from 1 to 8 parts by weight.

When the amount of the component (D0) is at least as large as the lower limit of the above-mentioned range, excellent lithography properties and excellent resist pattern shape can be obtained. On the other hand, when the amount of the component (D0) is no more than the upper limit of the above-mentioned range, sensitivity can be maintained at a satisfactory level, and through-put becomes excellent.

<Component (F)>

The negative tone resist composition for solvent developing of the first aspect of the present invention includes a fluorine additive (F) containing a fluorine-containing polymeric compound (f) which has a structural unit (f0-1) represented by general formula (f0-1) shown below or a structural unit (f-0-2) represented by general formula (f0-2) shown below. In the prevent invention, the resist composition preferably includes a fluorine additive (F) containing a fluorine-containing polymeric compound (f) which has a structural unit (f0-1) represented by general formula (f0-1).

[Chemical Formula 34]

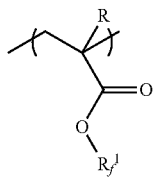
(f0-1)

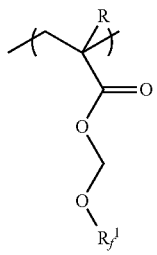
(f0-2)

In the formulae, R represents a hydrogen atom, an alkyl group of 1 to 5 carbon atoms or a halogenated alkyl group of 1 to 5 carbon atoms; and $R_f^1$ represents an aliphatic hydrocarbon group containing a fluorine atom.

In the formulae, R is the same as defined above.

$R_f^1$ is an aliphatic hydrocarbon group containing a fluorine atom. As the aliphatic hydrocarbon group containing a fluorine atom for $R_f^1$, the same groups as the aliphatic hydrocarbon groups described above for $Va^1$ in the aforementioned formula (a1-1), which is monovalent and contains a fluorine atom, can be mentioned.

Examples of the aliphatic hydrocarbon group containing a fluorine atom for $R_f^1$ include a linear or branched aliphatic hydrocarbon group and an aliphatic hydrocarbon group containing a ring in the structure thereof. Among these, the linear or branched aliphatic hydrocarbon group is preferable, and a group represented by general formula (f04-1) shown below is preferable.

[Chemical Formula 35]

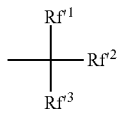
(f0-r-1)

In the formula, $Rf^1$ to $Rf^3$ each independently represents an alkyl group of 1 to 10 carbon atoms in which at least one hydrogen atom has been substituted with a fluorine atom, a fluorine atom, a hydrogen atom or an alkyl group of 1 to 10 carbon atoms. At least two or more of $Rf^1$ to $Rf^3$ may be mutually bonded to form a monocyclic or polycyclic aliphatic cyclic group, and the aliphatic cyclic group may include an oxygen atom in the ring skeleton thereof.

In the formula, it is preferable that $Rf^1$ to $Rf^3$ each independently represents an alkyl group of 1 to 10 carbon atoms in which at least one hydrogen atom has been substituted with a fluorine atom, a hydrogen atom, or an alkyl group of 1 to 10 carbon atoms, and it is more preferable that $Rf^1$ represents an alkyl group of 1 to 10 carbon atoms in which at least one hydrogen atom has been substituted with a fluorine atom and $Rf^2$ and $Rf^3$ each independently represents an alkyl group of 1 to 10 carbon atoms in terms of improving the contrast.

Specific examples of the structural unit represented by formula (ID-1) or (f0-2) are shown below.

In the formulae, at least one hydrogen atom in the adamantyl group has been substituted with a fluorine atom.

[Chemical Formula 36]

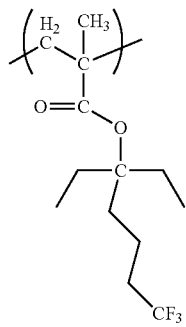
(f0-1-1)

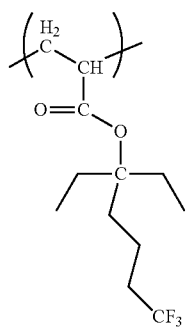
(f0-1-2)

[Chemical Formula 37]

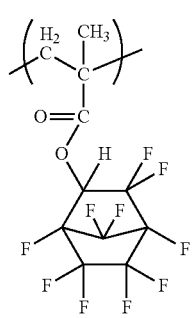
(f0-1-3)

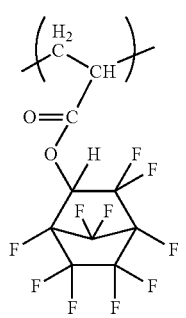
(f0-1-4)

-continued
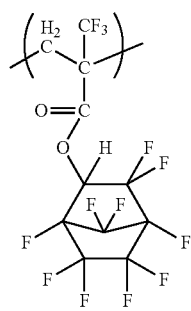 (f0-1-5)
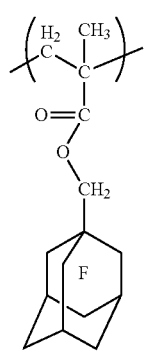 (f0-1-6)
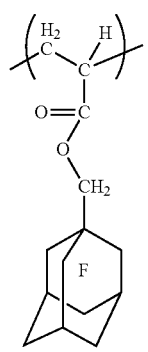 (f0-1-7)
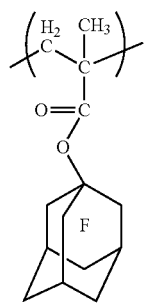 (f0-1-8)
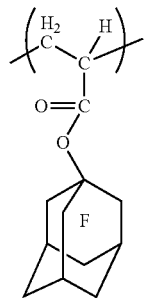 (f0-1-9)
-continued
[Chemical Formula 38]
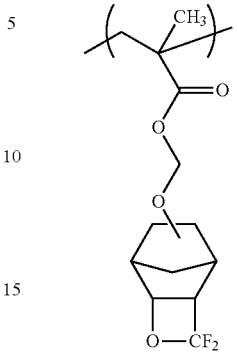 (f0-2-1)
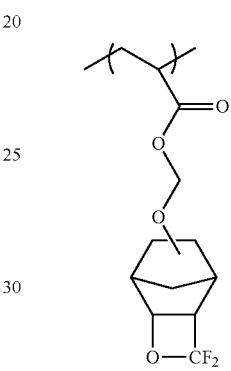 (f0-2-2)
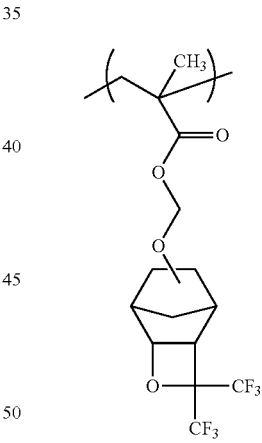 (f0-2-3)
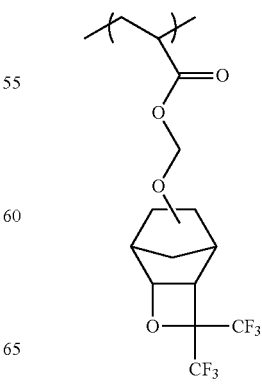 (f0-2-4)

-continued

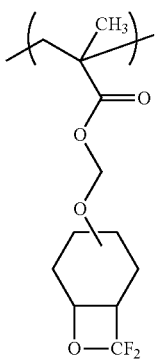
(f0-2-5)

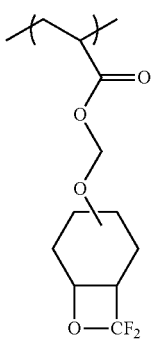
(f0-2-6)

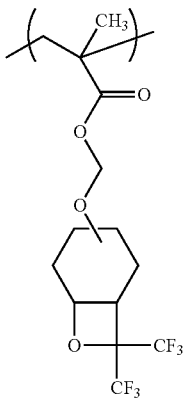
(f0-2-7)

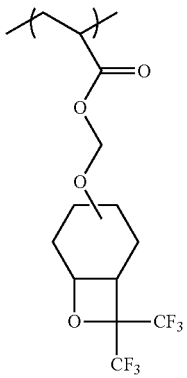
(f0-2-8)

In the present invention, among these, the group represented by general formula (f0-1-1) or (f0-1-2) is preferable.

In the present invention, the fluorine-containing polymeric compound (t) may be a homopolymer or copolymer constituted of a structural unit (f-0-1) or a structural unit (a0-2), and may include a structural unit other than the structural units (f0-1) and (f0-2). As the structural unit other than the structural units (f0-1) and (f0-2), the structural units (a1) to (a5) can be mentioned, and the structural unit (a1) or (a4) is preferable, and the structural unit (a1) containing an acid decomposable group that exhibits increased polarity by the action of acid is more preferable.

As the structural unit (a1), a structural unit represented by any one of the aforementioned general formulae (a1-1) to (a1-3) is preferable, and a structural unit represented by the aforementioned formula (a1-1) is particularly desirable.

The weight average molecular weight (Mw) (the polystyrene equivalent value determined by gel permeation chromatography) of the component (F) is preferably 1,000 to 50,000, more preferably 3,000 to 40,000, and most preferably 5,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.0 to 2.5.

As the component (F), one type may be used alone, or two or more types may be used in combination.

The component (F) is typically used in an amount within a range from 0.5 to 10 parts by weight, relative to 100 parts by weight of the component (A).

By using the negative tone resist composition for solvent developing of the first aspect of the present invention including a fluorine additive (F) containing a fluorine-containing polymeric compound (I) which has a structural unit (f0-1) represented by general formula (f0-1) or a structural unit (f0-2) represented by general formula (f0-2), excellent film retentiveness of a resist film can be obtained. It is presumed that, when the fluorine additive (F) includes the structural unit (a1), the film retentiveness of a resist film can be further improved. By using the component (F) and the component (D0) in combination, the higher level of film retentiveness of a resist film can be obtained.

<Acid Generator Component; Component (B)>

The negative tone resist composition for solvent developing according to the first aspect of the present invention may further include an acid generator component (B) (hereafter, referred to as "component (B)") which generates acid upon exposure. As the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators. Among these, onium salt acid generators are preferably used.

Examples of the onium salt acid generators include a compound represented by general formula (b-1) shown below (hereafter, sometimes referred to as "component (b-1)"), a compound represented by general formula (b-2) shown below (hereafter, sometimes referred to as "component (b-2)") and a compound represented by general formula (b-3) shown below (hereafter, sometimes referred to as "component (b-3)").

[Chemical Formula 39]

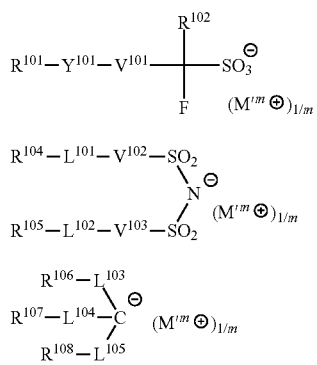

(b-1)

(b-2)

(b-3)

In the formulae, $R^{101}$ and $R^{104}$ to $R^{108}$ each independently represents a cyclic group which may have a substituent, a chain-like alkyl group which may have a substituent or a chain-like alkenyl group which may have a substituent, provided that, $R^{104}$ and $R^{105}$ may be mutually bonded to form a ring; provided that, two of $R^{106}$ to $R^{107}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ and $L^{102}$ each independently represents a single bond or an oxygen atom; $L^{103}$ to $L^{105}$ each independently represents a single bond, —CO— or —SO$_2$—; and $M^{m+}$ represents an organic cation having a valency of m.

{Anion Moiety}
Anion Moiety of Component (b-1)
In the formula (b-1), $R^{101}$ represents a cyclic group which may have a substituent, a chain-like alkyl group which may have a substituent or a chain-like alkenyl group which may have a substituent.

(Cyclic Group which May have a Substituent)
The cyclic group is preferably a cyclic hydrocarbon group, and the cyclic hydrocarbon group may be either an aromatic hydrocarbon group or an aliphatic hydrocarbon group.

As the aromatic hydrocarbon group for $R^{101}$, groups in which one hydrogen atom has been removed from an aromatic hydrocarbon ring described above in relation to the divalent aromatic hydrocarbon group for $Va^1$ in the formula (a1-1) or an aromatic compound containing two or more aromatic ring can be mentioned, and a phenyl group or a naphthyl group is preferable.

As the cyclic aliphatic hydrocarbon group for $R^{101}$, groups in which one hydrogen atom has been removed from a monocycloalkane or a polycycloalkane exemplified above in the explanation of the divalent aliphatic hydrocarbon group for $Va^1$ in the formula (a1-1) can be mentioned. Among these, as polycycloalkanes, polycycloalkanes containing a bridged ring-type polycyclic skeleton such as an adamantyl group, a norbornyl group and the like, and polycycloalkanes containing a condensed ring-type polycyclic skeleton such as a cyclic group containing a steroid skeleton can be mentioned. In the present specification, the term "steroid skeleton" means a skeleton (st) in which three 6-membered rings and one 5-membered ring have been linked, and the structure thereof is shown below.

[Chemical Formula 40]

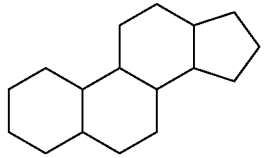

(st)

Further, the cyclic hydrocarbon group for $R^{101}$ may contain a hetero atom like as a heterocycle, and specific examples thereof include lactone-containing cyclic groups represented by the aforementioned general formulae (a2-r-1) to (a2-r-7), —SO$_2$— containing cyclic groups represented by the aforementioned formulae (a5-r-1) to (a5-r-4) and heterocycles shown below.

[Chemical Formula 41]

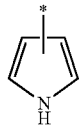

(r-hr-1)

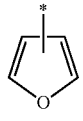

(r-hr-2)

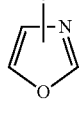

(r-hr-3)

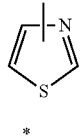

(r-hr-4)

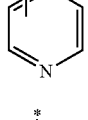

(r-hr-5)

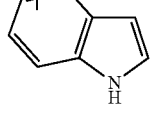

(r-hr-6)

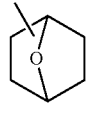

(r-hr-7)

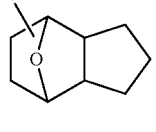

(r-hr-8)

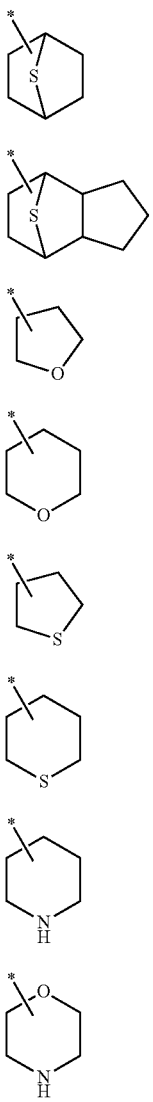

(r-hr-9)

(r-hr-10)

(r-hr-11)

(r-hr-12)

(r-hr-13)

(r-hr-14)

(r-hr-15)

(r-hr-16)

As the substituent for substituting the cyclic hydrocarbon group for $R^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is most desirable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent include a fluorine atom, a chlorine atom, a bromine atom and an iodine atom, and a fluorine atom is preferable.

Example of the halogenated alkyl group as a substituent includes a group in which a part or all of the hydrogen atoms within an alkyl group of 1 to 5 carbon atoms such as a methyl group, an ethyl group, a propyl group, an n-butyl group or a tert-butyl group have been substituted with the aforementioned halogen atoms.

(Chain-Like Alkyl Group which May have a Substituent)

The chain-like alkyl group for $R^{101}$ may be either linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

(Chain-Like Alkenyl Group which May have a Substituent)

The chain-like alkenyl group for $R^{101}$ may be linear or branched, and preferably has 2 to 10 carbon atoms, more preferably 2 to 5 carbon atoms, still more preferably 2 to 4 carbon atoms, and particularly preferably 3 carbon atoms. Examples of linear alkenyl groups include a vinyl group, a propenyl group (an allyl group) and a butynyl group. Examples of branched alkenyl groups include a 1-methylpropenyl group and a 2-methylpropenyl group.

Among the above-mentioned examples, as the chain-like alkenyl group, a propenyl group is particularly desirable.

As the substituent for substituting the chain-like alkyl group or alkenyl group for $R^{101}$, an alkoxy group, a halogen atom, a halogenated alkyl group, a hydroxyl group, a carbonyl group, a nitro group, an amino group, the same cyclic group as described above for $R^{101}$ or the like can be used.

Among these, as $R^{101}$, a cyclic group which may have a substituent is preferable, and a cyclic hydrocarbon group which may have a substituent is more preferable. Specific examples include a group in which one or more hydrogen atoms have been removed from a phenyl group, a naphthyl group or a polycycloalkane, lactone-containing cyclic groups represented by the aforementioned formulae (a2-r-1) to (a2-r-7) and —$SO_2$—containing cyclic groups represented by the aforementioned formulae (a5-r-1) to (a5-r-4) and the like.

In the formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linkage groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amide bond (—C(=O)—NH—), a carbonyl group (—C(=O)—) and a carbonate group (—O—C(=O)—O—); and a combination of any of the aforementioned non-hydrocarbon, oxygen atom-containing linking groups with an alkylene group. Furthermore, the combinations may have a sulfonyl group (—$SO_2$—) bonded thereto. As the combination, the linking groups represented by formulae (y-al-1) to (y-al-7) shown below can be mentioned.

[Chemical Formula 42]

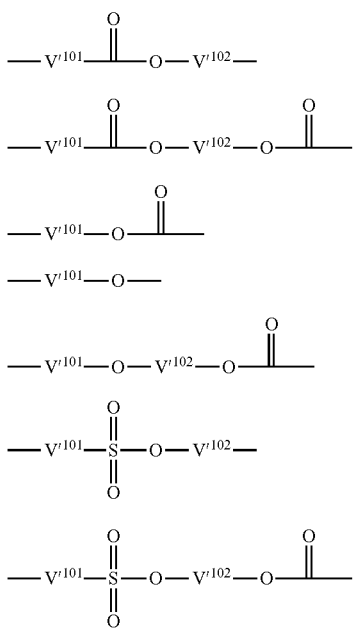

In the formulae, $V'^{101}$ represents a single bond or an alkylene group of 1 to 5 carbon atoms; and $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms.

As the alkylene group for $V'^{101}$ and $V'^{102}$, a linear alkylene group or a branched alkylene group can be used, and a linear alkylene group is preferable.

Specific examples of the alkylene group for $V'^{101}$ and $V'^{102}$ include a methylene group [—$CH_2$—]; alkylmethylene groups such as —CH($CH_3$)—, —CH($CH_2CH_3$)—, —C($CH_3$)$_2$—, —C($CH_3$)($CH_2CH_3$)—, —C($CH_3$) ($CH_2CH_2CH_3$)— and —C($CH_2CH_3$)$_2$—; an ethylene group [—$CH_2CH_2$—]; alkylethylene groups such as —CH($CH_3$) $CH_2$—, —CH($CH_3$)CH($CH_3$)—, —C($CH_3$)$_2CH_2$— and —CH($CH_2CH_3$)$CH_2$—; a trimethylene group (n-propylene group) [—$CH_2CH_2CH_2$—]; alkyltrimethylene groups such as —CH($CH_3$)$CH_2CH_2$— and —$CH_2$CH($CH_3$)$CH_2$—; a tetramethylene group [—$CH_2CH_2CH_2CH_2$—]; alkyltetramethylene groups such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

Further, part of methylene group within the alkylene group for $V'^{101}$ and $V'^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group described above for $Ra'^3$ in the aforementioned formula (a1-r-1), and a cyclohexylene group, 1,5-adamantylene group or 2,6-adamantylene group is more preferable.

$Y^{101}$ is preferably a divalent linking group containing an ether bond or an ester bond, and linking groups represented by the aforementioned formulae (y-al-1) to (y-al-5) are preferable.

In the formula (b-1), $V^{101}$ represents a single bond, an alkylene group or a fluorinated alkylene group. The alkylene group or fluorinated alkylene group for $V^{101}$ preferably has 1 to 4 carbon atoms. As the fluorinated alkylene group for $V^{101}$, a group in which part or all of the hydrogen atoms within the aforementioned alkylene group for $V^{101}$ has been substituted with fluorine atoms can be used. Among these, $V^{101}$ is preferably a single bond or a fluorinated alkylene group of 1 to 4 carbon atoms.

In the formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and is more preferably a fluorine atom.

As specific examples of anion moieties of the formula (b-1),

When $Y^{101}$ is a single bond, fluorinated alkylsulfonate anions such as a trifluoromethanesulfonate anion or a perfluorobutanesulfonate anion can be mentioned; and when $Y^{101}$ is a divalent linking group containing an oxygen atom, anions represented by formulae (an-1) to (an-3) shown below can be mentioned.

[Chemical Formula 43]

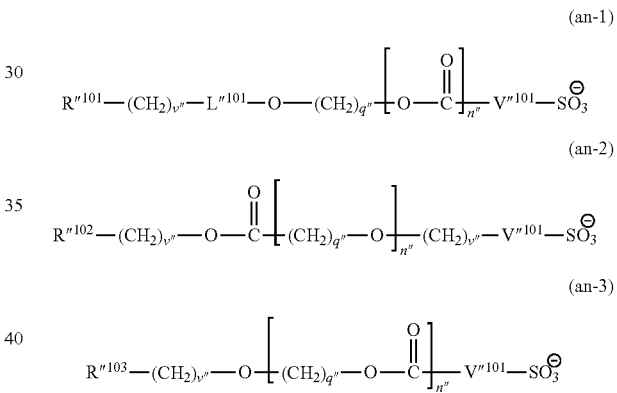

In the formulae, $R''^{101}$ represents an aliphatic cyclic group which may have a substituent, a group represented by any one of the aforementioned formulae (r-hr-1) to (r-hr-6) or a chain-like alkyl group which may have a substituent; $R''^{102}$ represents an aliphatic cyclic group which may have a substituent, a lactone-containing cyclic group represented by any one of the formulae (a2-r-1) to (a2-r-7) or an —$SO_2$— containing cyclic group represented by any one of the formulae (a5-r-1) to (a5-r-4); $R''^{103}$ represents an aromatic cyclic group which may have a substituent, an aliphatic cyclic group which may have a substituent or a chain-like alkenyl group which may have a substituent; $V''^{101}$ represents a fluorinated alkylene group; $L''^{101}$ represents —C(=O)— or —$SO_2$—; v" each independently represents an integer of 0 to 3; q" each independently represents an integer of 1 to 20; n" represents 0 or 1.

As the aliphatic cyclic group for $R''^{101}$, $R''^{102}$ and $R''^{103}$ which may have a substituent, the same groups as the cyclic aliphatic hydrocarbon group for $R^{101}$ described above are preferable. As the substituent, the same groups as those described above for substituting the cyclic aliphatic hydrocarbon group for $R^{101}$ can be mentioned.

As the aromatic cyclic group for $R'''^{103}$ which may have a substituent, the same groups as the aromatic hydrocarbon group exemplified as a cyclic hydrocarbon group for $R^{101}$ described above are preferable. As the substituent, the same groups as those described above for substituting the aromatic hydrocarbon group for $R^{101}$ can be mentioned.

As the chain-like alkyl group for $R'''^{101}$ which may have a substituent, the same groups exemplified as the chain-like alkyl group for $R^{101}$ are preferable. As the chain-like alkenyl group for $R'''^{103}$ which may have a substituent, the same groups exemplified above as the chain-like alkenyl group for $R^{101}$ are preferable. $V'''^{101}$ is preferably a fluorinated alkylene group of 1 to 3 carbon atoms, and particularly preferably —$CF_2$—, —$CF_2CF_2$—, —$CHFCF_2$—, —$CF(CF_3)CF_2$— or —$CH(CF_3)CF_2$—.

Anion Moiety of Component (b-2)

In formula (b-2), $R^{104}$ and $R^{105}$ each independently represents a cyclic group which may have a substituent, a chain-like alkyl group which may have a substituent or a chain-like alkenyl group which may have a substituent, and is the same groups as those defined above for $R^{101}$ in the aforementioned formula (b-1), provided that, $R^{104}$ and $R^{105}$ may be mutually bonded to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, preferably 1 to 7, and more preferably 1 to 3. The smaller the number of carbon atoms of the chain-like alkyl group for $R^{104}$ and $R^{105}$ within the above-mentioned range of the number of carbon atoms, the more the solubility in a resist solvent is improved. Further, in the chain-like alkyl group for $R^{104}$ and $R^{105}$, it is preferable that the number of hydrogen atoms substituted with fluorine atoms is as large as possible because the acid strength increases and the transparency to high energy radiation of 200 nm or less or electron beam is improved. The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same groups as those defined above for $V^{101}$ in the aforementioned formula (b-1).

In the formula (b-2), $L^{101}$ and $L^{102}$ each independently represents a single bond or an oxygen atom.

Anion Moiety of Component (b-3)

In formula (b-3), $R^{106}$ to $R^{108}$ each independently represents a cyclic group which may have a substituent, a chain-like alkyl group which may have a substituent or a chain-like alkenyl group which may have a substituent, and is the same groups as those defined above for $R^{101}$ in the aforementioned formula (b-1).

$L^{103}$ to $L^{105}$ each independently represents a single bond, —CO— or —$SO_2$—.

{Cation Moiety}

In the formulae (b-1), (b-2) and (b-3), $M^{m+}$ represents an organic cation having a valency of m, provided that the cation moiety in the compound represented by (b1-1) is excluded. Among these, a sulfonium cation or an iodonium cation is preferable, and cation moieties represented by general formulae (ca-1) to (ca-4) shown below are particularly preferable.

[Chemical Formula 44]

(ca-1)

(ca-2)

(ca-3)

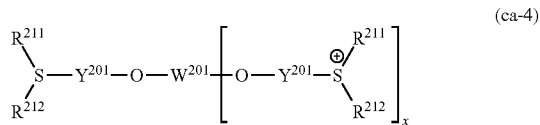
(ca-4)

In the formulae, each of $R^{201}$ to $R^{207}$, $R^{211}$ and $R^{212}$ independently represents an aryl group which may have a substituent, an alkyl group which may have a substituent or an alkenyl group which may have a substituent; $R^{201}$ to $R^{203}$, $R^{206}$ and $R^{207}$, and $R^{211}$ and $R^{212}$ may be mutually bonded to form a ring with the sulfur atom; $R^{208}$ and $R^{209}$ each represents a hydrogen atom or an alkyl group of 1 to 5 carbon atoms; $R^{210}$ represents an aryl group which may have a substituent, an alkyl group which may have a substituent, an alkenyl group which may have a substituent or an —$SO_2$— containing cyclic group which may have a substituent; $L^{201}$ represents —C(=O)— or —C(=O)—O—; $Y^{201}$ each independently represents an arylene group, an alkylene group or an alkenylene group; x represents 1 or 2; and $W^{201}$ represents a linking group having a valency of (x+1).

As the aryl group for $R^{201}$ to $R^{207}$, $R^{211}$ and $R^{212}$, an unsubstituted aryl group of 6 to 20 carbon atoms can be mentioned, and a phenyl group or a naphthyl group is preferable.

As the alkyl group for $R^{201}$ to $R^{207}$, $R^{211}$ and $R^{212}$, a chain-like or cyclic alkyl group of 1 to 30 carbon atoms is preferable.

The alkenyl group for $R^{201}$ to $R^{207}$, $R^{211}$ and $R^{212}$ preferably has 2 to 10 carbon atoms.

Specific examples of the substituent which $R^{201}$ to $R^{207}$, $R^{210}$ and $R^{212}$ may have include an alkyl group, a halogen atom, a halogenated alkyl group, a carbonyl group, a cyano group, an amino group, an aryl group, an arylthio group and groups represented by formulae (ca-r-1) to (ca-r-7) shown below.

As the aryl group within the arylthio group as a substituent, the same aryl groups as those described above for $R^{101}$ can be mentioned, and specific examples of the arylthio group include a phenylthio group or a biphenylthio group.

[Chemical Formula 45]

[ca-r-1]

[ca-r-2]

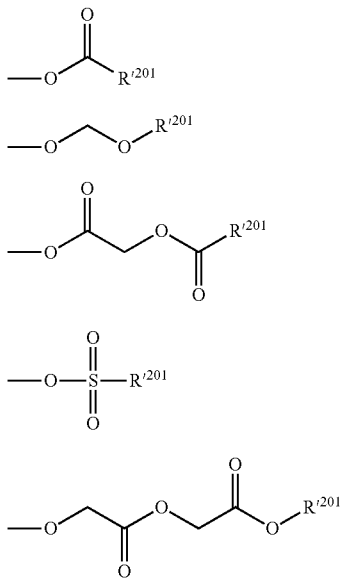

In the formulae, $R'^{201}$ each independently represents a hydrogen atom, a cyclic group which may have a substituent, a chain-like alkyl group which may have a substituent or a chain-like alkenyl group which may have a substituent.

As the cyclic group which may have a substituent, the chain-like alkyl group which may have a substituent and the chain-like alkenyl group which may have a substituent for $R'^{201}$, the same groups as those described above for $R^{101}$ in the aforementioned formula (b-1) can be mentioned. As the cyclic group which may have a substituent and chain-like alkyl group which may have a substituent, the same groups as those described above for the acid dissociable group represented by the aforementioned formula (a1-r-2) can be also mentioned.

When $R^{201}$ to $R^{203}$, $R^{206}$ and $R^{207}$, and $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —SO$_2$—, —COO—, —CONH— or —N(R$_N$)— (wherein R$_N$ represents an alkyl group of 1 to 5 carbon atoms). As the ring to be formed, the ring containing the sulfur atom in the skeleton thereof is preferably a 3 to 10-membered ring, and particularly preferably a 5 to 7-membered ring. Examples of the formed ring include a thiophene ring, a thiazole ring, a benzothiophene ring, a thianthrene ring, a dibenzothiophene ring, a 9H-thioxanthene ring, a thioxanthone ring, a phenoxathiin ring, a tetrahydrothiophenium ring and a tetrahydrothiopyranium ring.

$R^{208}$ and $R^{209}$ each independently represents a hydrogen atom or an alkyl group of 1 to 5 carbon atoms, is preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

$R^{210}$ represents an aryl group which may have a substituent, an alkyl group which may have a substituent, an alkenyl group which may have a substituent or an —SO$_2$— containing cyclic group which may have a substituent.

As the aryl group for $R^{210}$, an unsubstituted aryl group of 6 to 20 carbon atoms can be mentioned, and a phenyl group or a naphthyl group is preferable.

As the alkyl group for $R^{210}$, a chain-like or cyclic alkyl group of 1 to 30 carbon atoms is preferable.

The alkenyl group for $R^{210}$ preferably has 2 to 10 carbon atoms.

As the —SO$_2$— containing cyclic group for $R^{210}$ which may have a substituent, the same groups as the "—SO$_2$— containing cyclic group" for $Ra^{21}$ in the general formula (a2-1) can be mentioned, and the group represented by the aforementioned general formula (a5-r-1) is preferable.

$Y^{201}$ each independently represents an arylene group, an alkylene group or an alkenylene group.

As the arylene group for $Y^{201}$, a group in which one hydrogen atom has been removed from an aryl group exemplified as an aromatic hydrocarbon group for $R^{101}$ in the aforementioned formula (b-1) can be mentioned.

As the alkylene group and the alkenylene group for $Y^{201}$, the same aliphatic hydrocarbon group as those described above for the divalent hydrocarbon group for $Va^1$ in the aforementioned general formula (a1-1) can be mentioned.

In the formula (ca-4), x represents 1 or 2.

$W^{201}$ represents a linking group having a valency of (x+1), that is, a divalent or trivalent linking group.

As the divalent linking group for $W^{201}$, a divalent hydrocarbon groups which may have a substituent is preferable, and as examples thereof, the same hydrocarbon group as those described above for $Ya^{21}$ in the general formula (a2-1) can be mentioned. The divalent linking group for $W^{201}$ may be linear, branched or cyclic, and cyclic is more preferable. Among these, an arylene group having two carbonyl groups, each bonded to the terminal thereof is preferable. As the arylene group, a phenylene group and a naphthylene group can be mentioned. Of these, a phenylene group is particularly desirable.

As the trivalent linking group for $W^{201}$, a group in which one hydrogen atom has been removed from the aforementioned divalent linking group for $W^{201}$, and a group in which the divalent linking group has been bonded to an another divalent linking group can be mentioned. The trivalent linking group for $W^{201}$ is preferably an arylene group having two carbonyl groups bonded thereto.

Specific examples of preferable cations represented by formula (ca-1) include cations represented by formulae (ca-1-1) to (ca-1-63) shown below.

[Chemical Formula 46]

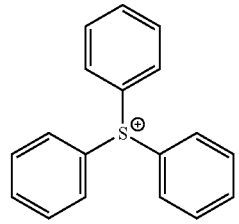

(ca-1-1)

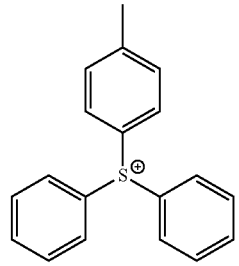

(ca-1-2)

(ca-1-3)
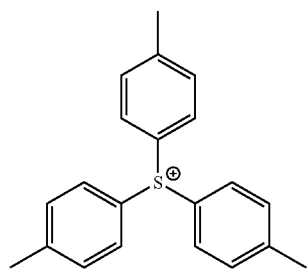
(ca-1-4)
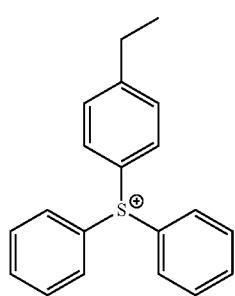
(ca-1-5)
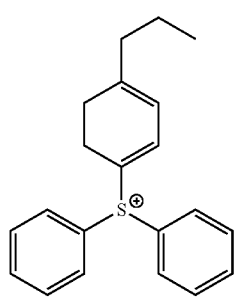
(ca-1-6)
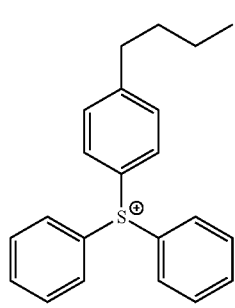
(ca-1-7)
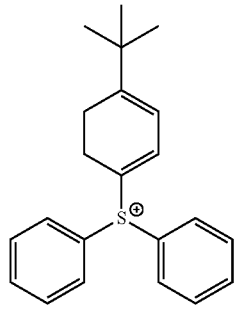
(ca-1-8)
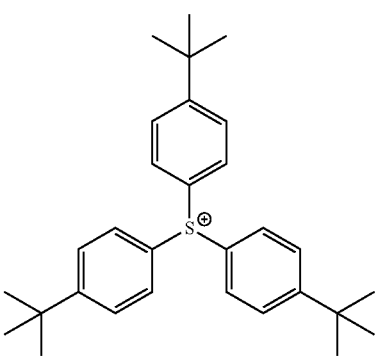
(ca-1-9)
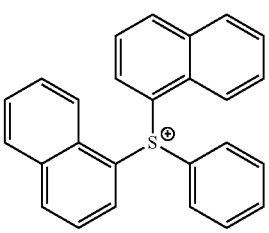
(ca-1-10)
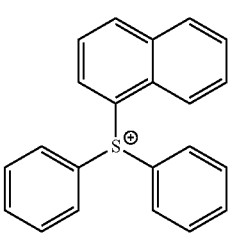
(ca-1-11)
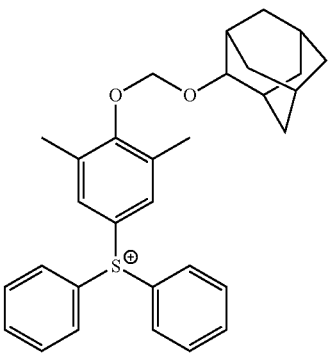
(ca-1-12)
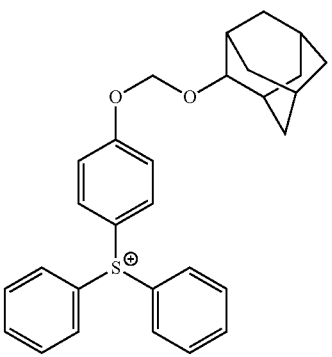

(ca-1-13)
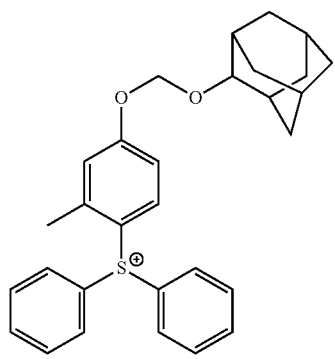
(ca-1-14)
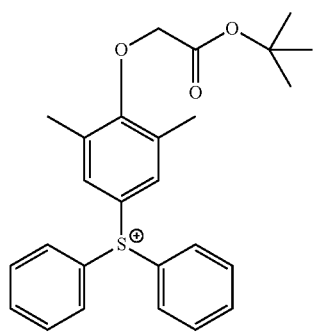
(ca-1-15)
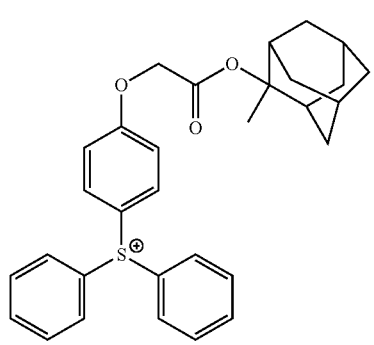
(ca-1-16)
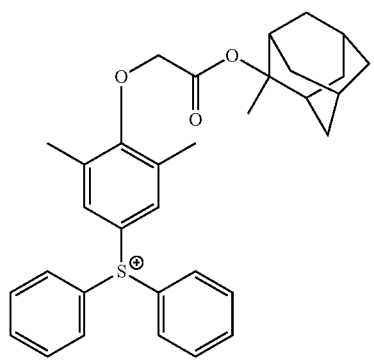
[Chemical Formula 47]
(ca-1-17)
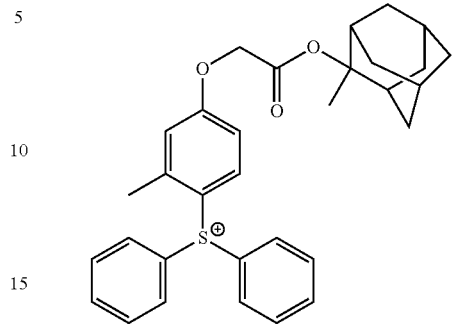
(ca-1-18)
(ca-1-19)
(ca-1-20)
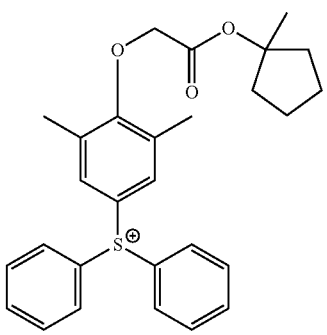

(ca-1-21) 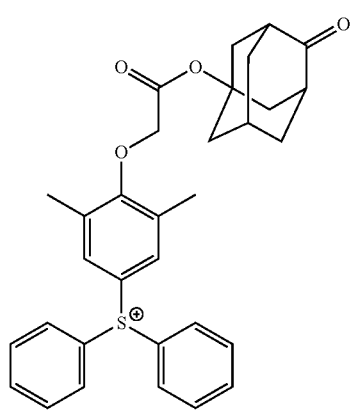
(ca-1-22) 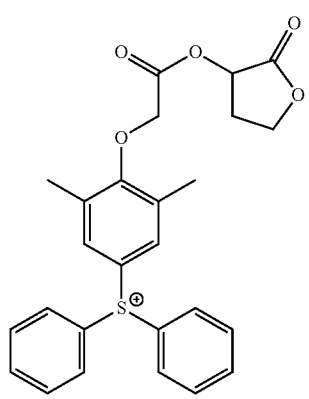
(ca-1-23) 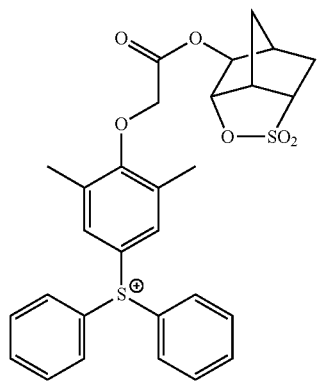
(ca-1-24) 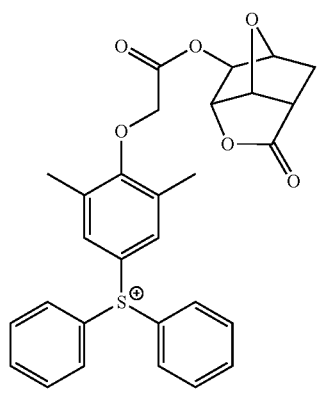
(ca-1-25) 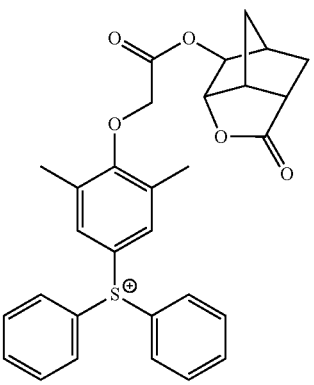
(ca-1-26) 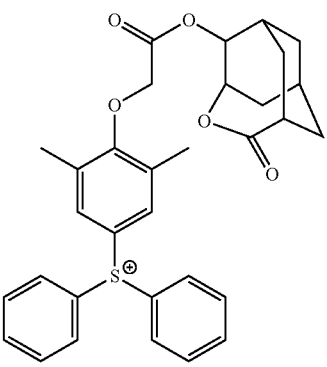
(ca-1-27) 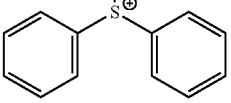
(ca-1-28) 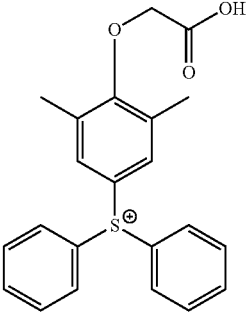
(ca-1-29) 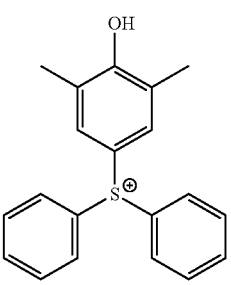

-continued
(ca-1-30)
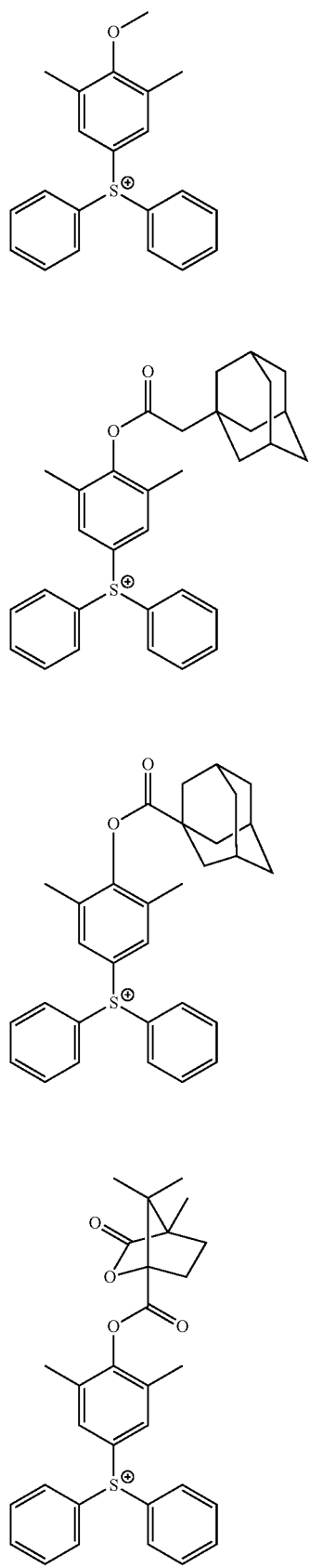
(ca-1-31)
(ca-1-32)
(ca-1-33)
-continued
[Chemical Formula 48]
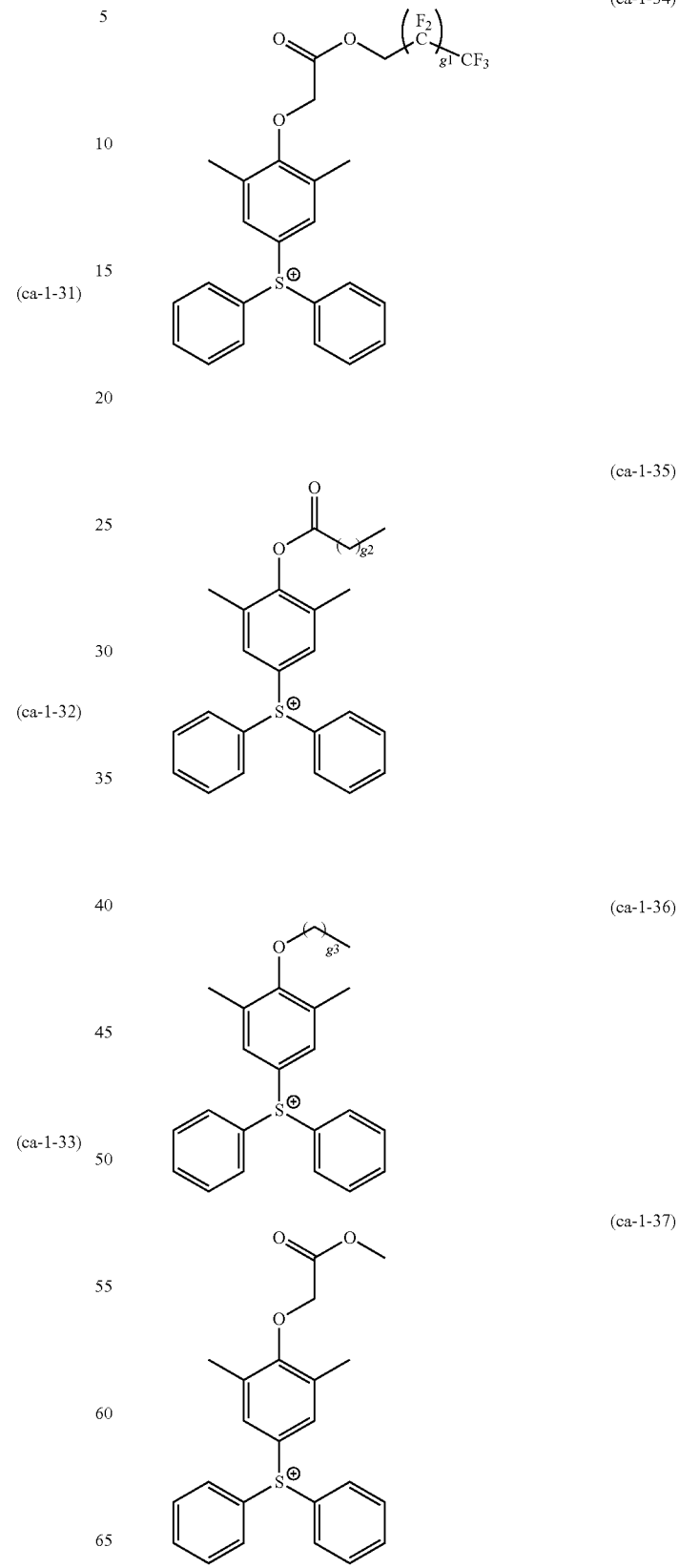
(ca-1-34)
(ca-1-35)
(ca-1-36)
(ca-1-37)

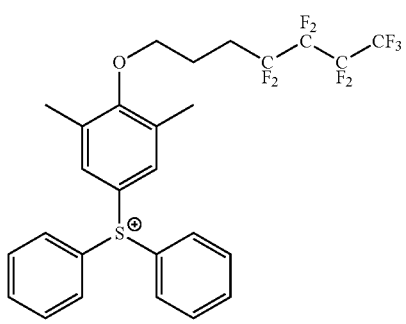 (ca-1-38)
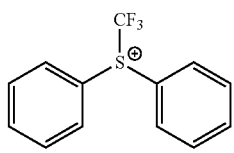 (ca-1-43)
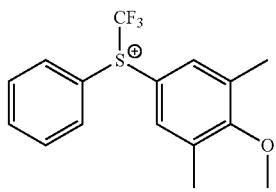 (ca-1-44)
(ca-1-39)
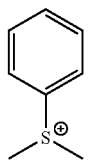 (ca-1-45)
 (ca-1-46)
(ca-1-47)
(ca-1-40)
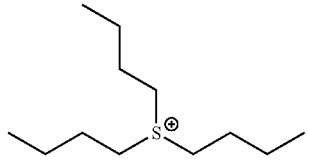 (ca-1-48)
(ca-1-41)
In the formulae, g1, g2 and g3 represent recurring numbers, wherein g1 is an integer of 1 to 5, g2 is an integer of 0 to 20, and g3 is an integer of 0 to 20.
[Chemical Formula 49]
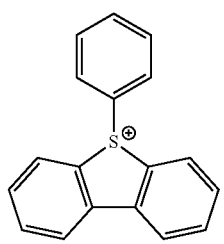 (ca-1-49)
(ca-1-42)
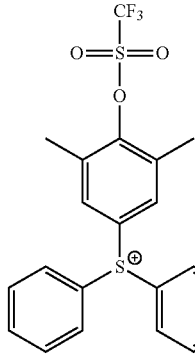

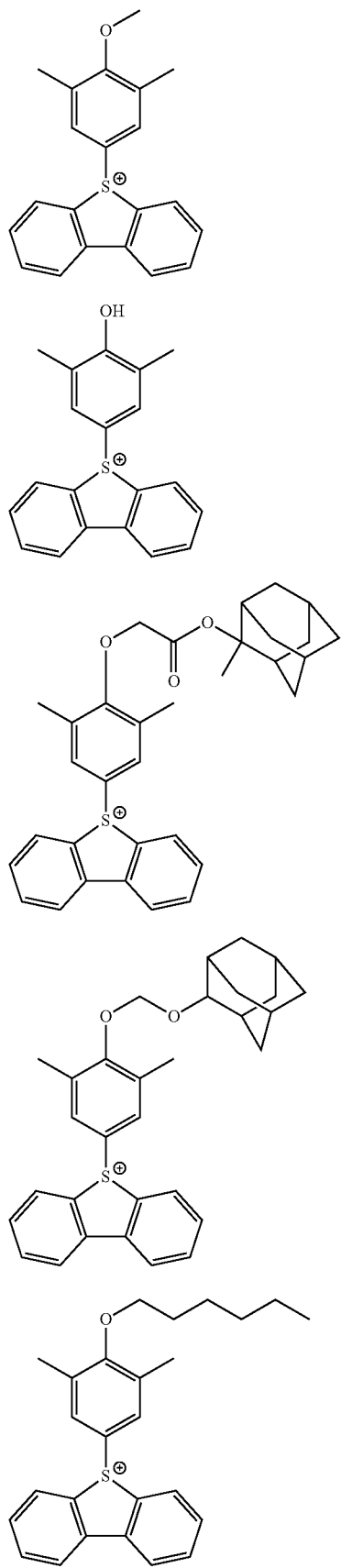
(ca-1-50)
(ca-1-51)
(ca-1-52)
(ca-1-53)
(ca-1-54)
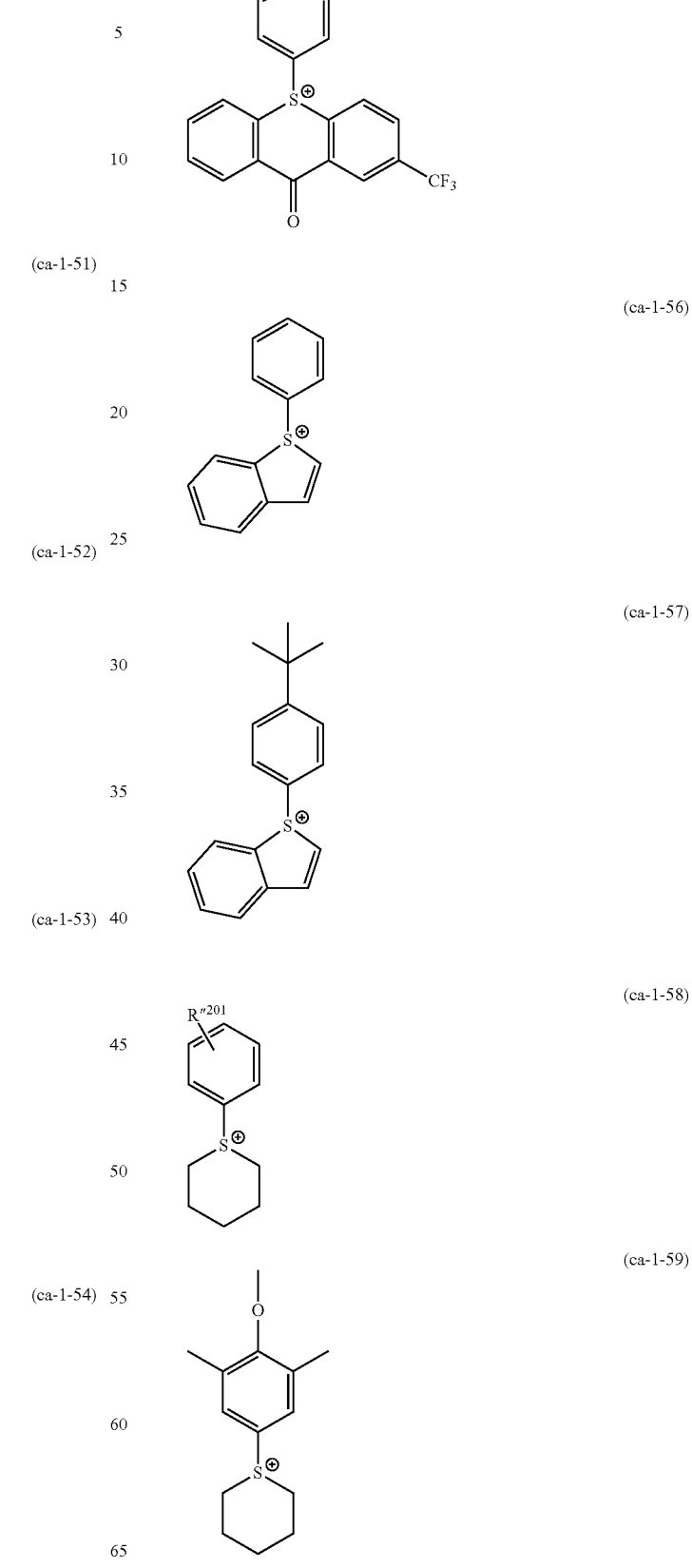
(ca-1-55)
(ca-1-56)
(ca-1-57)
(ca-1-58)
(ca-1-59)

-continued (ca-1-60)
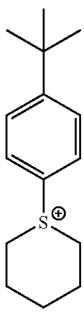

(ca-1-61)
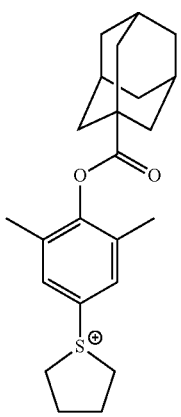

(ca-1-62)
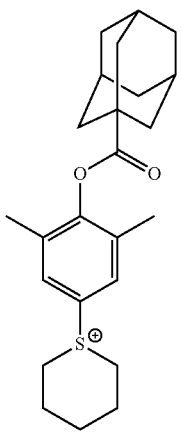

(ca-1-63)
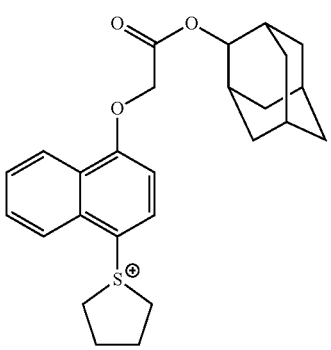

In the formulae, $R'^{201}$ represents a hydrogen atom or a substituent, and as the substituent, the same groups as those described above for substituting the $R^{201}$ to $R^{207}$ and $R^{210}$ to $R^{212}$ can be mentioned.

Specific examples of preferable cations represented by the formula (ca-3) include cations represented by formulae (ca-3-1) to (ca-3-6) shown below.

[Chemical Formula 50]

(ca-3-1)
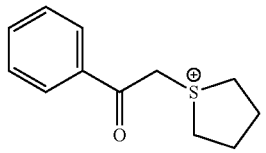

(ca-3-2)
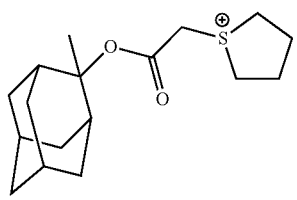

(ca-3-3)
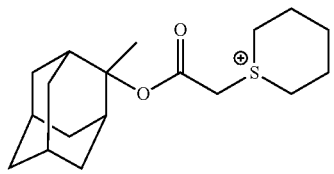

(ca-3-4)
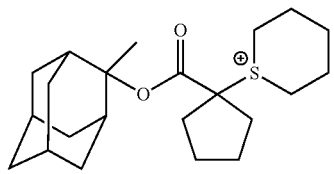

(ca-3-5)
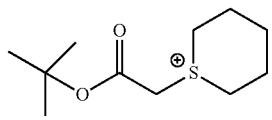

(ca-3-6)
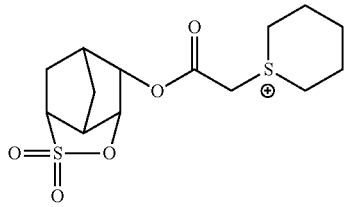

Specific examples of preferable cations represented by formula (ca-4) include cations represented by formulae (ca-4-1) to (ca-4-2) shown below.

[Chemical Formula 51]

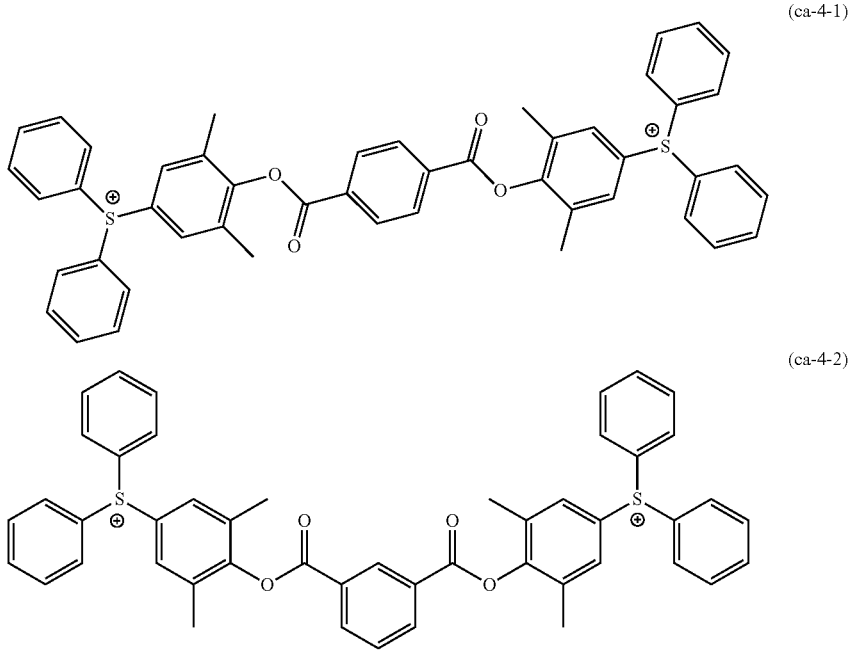

(ca-4-1)

(ca-4-2)

As the component (B), one type of these acid generators may be used alone, or two or more types may be used in combination.

When the negative tone resist composition for solvent developing of the first aspect of the present invention contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight. When the amount of the component (B) is within the above-mentioned range, formation of a resist pattern can be satisfactorily performed. Further, by virtue of the above-mentioned range, when each of the components is dissolved in an organic solvent, a uniform solution can be obtained and the storage stability becomes satisfactory.

<Optional Components>

[Component (D2)]

The negative tone resist composition for solvent developing according to the first aspect of the present invention may further include an acid diffusion control agent component other than the component (D0). As a nitrogen-containing organic compound which does not fall under the definition of the component (D0) (hereafter, referred to as "component (D2)"), any of the conventionally known aliphatic amines and aromatic amines can be used. When the negative tone resist composition for solvent developing contains the component (D2), the amount of the component (D2) is used in an amount within a range from 0.01 to 5 parts by weight, relative to 100 parts by weight of the component (A). When the amount of the component (D2) is within the above-mentioned range, the shape of the resist pattern and the post exposure stability of the latent image formed by the pattern-wise exposure of the resist layer are improved.

[Component (E)]

Furthermore, in the negative tone resist composition for solvent developing according to the first aspect of the present invention (in particular, in the case where the acid diffusion control agent component other than the component (D0) is used), for preventing any deterioration in sensitivity, and improving the resist pattern shape and the post exposure stability of the latent image formed by the pattern-wise exposure of the resist layer, at least one compound (E) (hereafter referred to as "component (E)") selected from the group consisting of organic carboxylic acids and phosphorus oxo acids and derivatives thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of phosphorous oxo acid derivatives include esters in which a hydrogen atom within the above-mentioned phosphorous oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenyl phosphonate, diphenyl phosphonate and dibenzyl phosphonate.

Examples of phosphinic acid derivatives include phenylphosphinic acid and phosphinic acid esters.

As the component (E), one type may be used alone, or two or more types may be used in combination.

The component (E) is typically used in an amount within a range from 0.01 to 5.0 parts by weight, relative to 100 parts by weight of the component (A).

[Component (S)]

The negative tone resist composition for solvent developing according to the first aspect of the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, PGMEA, PGME, γ-butyrolactone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL weight ratio or PGMEA:cyclohexanone weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a resist solution to a substrate. In general, the organic solvent is used in an amount such that the solid content of the resist composition becomes within the range from 1 to 20% by weight, and preferably from 2 to 15% by weight.

If desired, other miscible additives can also be added to the negative tone resist composition for solvent developing according to the first aspect of the present invention. Examples of such miscible additives include additive resins for improving the performance of the resist film, dissolution inhibitors, plasticizers, stabilizers, colorants, halation prevention agents, and dyes.

The negative tone resist composition for solvent developing according to the first aspect of the present invention exhibits excellent film retentiveness of a resist film after development. The reason for this has not been elucidated yet, but is presumed as follows. The photodecomposable quencher (D0) contained in the negative tone resist composition for solvent developing according to the first aspect of the present invention generates acid having a pKa of 2.0 or more. Therefore, it is presumed that the component (D0) exhibits a high quenching effect, and the anion moiety generated by decomposition of the component (D0) at exposed portions exhibits an effect of inhibiting the dissolution of the acid, and therefore, the resist composition exhibits excellent film retentiveness of a resist film.

<<Method of Forming a Resist Pattern>>

More specifically, the method for forming a resist pattern of the second aspect of the present invention can be performed, for example, as follows.

Firstly, a negative tone resist composition for solvent developing of the first aspect of the present invention is applied to a substrate using a spinner or the like, and a bake treatment (post applied bake (PAB)) is conducted at a temperature of 80 to 150° C. for 40 to 120 seconds, preferably 60 to 90 seconds, to form a resist film. Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds. The resulting resist film is subjected to developing treatment using an organic developing solution, preferably followed by rinsing with a rinse liquid containing an organic solvent, and then drying is conducted.

After the developing treatment or the rinsing, the developing solution or the rinse liquid remaining on the pattern can be removed by a treatment using a supercritical fluid.

If necessary, after the developing treatment, the rinsing or the treatment with a supercritical fluid, a bake treatment (post bake) may be conducted to remove any remaining organic solvent.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic anti-reflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film is formed (triple-layer resist method).

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which preferably have a boiling point within a range from 70 to 180° C. and more preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As the organic solvent contained in the organic-based solvent used for developing, any of the conventional organic solvents can be used which are capable of dissolving the base component (A) (prior to exposure) can be appropriately selected. Specific examples of the organic solvent include ketone solvents, ester solvents, and nitrile solvents. As an ester solvent, butyl acetate is preferable. As a ketone solvent, methyl amyl ketone (2-heptanone) is preferable.

A ketone solvent is an organic solvent containing C—C(═O)—C within the structure thereof. An ester solvent is an organic solvent containing C—C(═O)—O—C within the structure thereof. An alcohol solvent is an organic solvent containing an alcoholic hydroxy group within the structure thereof, and an "alcoholic hydroxy group" refers to a hydroxy group bonded to a carbon atom of an aliphatic hydrocarbon group. An amide solvent is an organic solvent containing an amide group within the structure thereof. An ether solvent is an organic solvent containing C—O—C within the structure thereof. Some organic solvents have a plurality of the functional groups which characterizes the aforementioned solvents within the structure thereof. In such a case, the organic solvent can be classified as any type of the solvent having the characteristic functional group. For example, diethyleneglycol monomethylether can be classified as either an alcohol solvent or an ether solvent. A hydrocarbon solvent consists of a hydrocarbon, and does not have any substituent (atom or group other than hydrogen and carbon).

Specific examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone).

Examples of ester solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate and propyl-3-methoxypropionate.

Examples of nitrile solvents include acetonitrile, propionitrile, valeronitrile, butyronitrile and the like.

If desired, the organic developing solution may have a conventional surfactant blended.

The development treatment using the organic developing solution can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

After the developing treatment and before drying, a rinse treatment may be performed using a rinse liquid containing an organic solvent. By performing a rinse treatment, an excellent pattern can be formed.

As the organic solvent used for the rinse liquid, any of the aforementioned organic solvents for the organic developing solution can be used which hardly dissolve the pattern. In general, at least one solvent selected from the group consisting of hydrocarbon solvents, ketone solvents, ester solvents, alcohol solvents, amide solvents and ether solvents is used. Among these, at least one solvent selected from the group consisting of hydrocarbon solvents, ketone solvents, ester solvents, alcohol solvents and amide solvents is preferable, more preferably at least one solvent selected from the group consisting of alcohol solvents and ester solvents, and an alcohol solvent is particularly desirable.

The alcohol solvent used for the rinse liquid is preferably a monohydric alcohol of 6 to 8 carbon atoms, and the monohydric alcohol may be linear, branched or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol and benzyl alcohol. Among these, 1-hexanol, 2-heptanol and 2-hexanol are preferable, and 1-hexanol and 2-hexanol are more preferable.

These organic solvents can be used individually, or at least 2 solvents may be mixed together. Further, an organic solvent other than the aforementioned examples or water may be mixed together. However, in consideration of the development characteristics, the amount of water within the rinse liquid, based on the total amount of the rinse liquid is preferably 30% by weight or less, more preferably 10% by weight or less, still more preferably 5% by weight or less, and most preferably 3% by weight or less.

If desired, the organic developing solution may have a conventional additive blended. Examples of the additive include surfactants. As the surfactant, the same surfactants as those described above can be mentioned, and a non-ionic surfactant is preferable, and a fluorine surfactant or a silicon surfactant is more preferable.

When a surfactant is added, the amount thereof based on the total amount of the rinse liquid is generally 0.001 to 5% by weight, preferably 0.005 to 2% by weight, and more preferably 0.01 to 0.5% by weight.

The rinse treatment (washing treatment) using the rinse liquid can be performed by a conventional rinse method. Examples thereof include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

EXAMPLES

As follows is a description of examples of the present invention, although the scope of the present invention is by no way limited by these examples.

The components were mixed in the mixing ratio indicated in following Tables 3 and 4 to obtain negative resist compositions (Examples 1 to 10, Comparative Examples 1 to 8).

TABLE 3

|  | Component (A) | Component (B) | Component (D0) | Component (F) | Component (S) |
|---|---|---|---|---|---|
| Example 1 | (A)-1 [100] | (B)-1 [3.5] | (D0)-1 [2.94] | (F)-1 [1.5] | (S)-1 [3200] |
| Example 2 | (A)-1 [100] | (B)-1 [3.5] | (D0)-2 [2.59] | (F)-1 [1.5] | (S)-1 [3200] |
| Example 3 | (A)-1 [100] | (B)-1 [3.5] | (D0)-3 [2.49] | (F)-1 [1.5] | (S)-1 [3200] |
| Example 4 | (A)-1 [100] | (B)-1 [3.5] | (D0)-4 [3.25] | (F)-1 [1.5] | (S)-1 [3200] |
| Example 5 | (A)-1 [100] | (B)-1 [3.5] | (D0)-5 [4.54] | (F)-1 [1.5] | (S)-1 [3200] |
| Example 6 | (A)-1 [100] | (B)-1 [3.5] | (D0)-6 [2.8] | (F)-1 [1.5] | (S)-1 [3200] |
| Example 7 | (A)-1 [100] | (B)-1 [3.5] | (D0)-4 [3.25] | (F)-2 [1.0] | (S)-1 [3200] |
| Example 8 | (A)-1 [100] | (B)-1 [3.5] | (D0)-4 [3.25] | (F)-3 [1.0] | (S)-1 [3200] |
| Example 9 | (A)-1 [100] | (B)-1 [3.5] | (D0)-4 [3.25] | (F)-4 [1.0] | (S)-1 [3200] |
| Example 10 | (A)-1 [100] | (B)-1 [3.5] | (D0)-4 [3.25] | (F)-5 [1.0] | (S)-1 [3200] |

TABLE 4

|  | Component (A) | Component (B) | Component (D0) | Component (F) | Component (S) |
|---|---|---|---|---|---|
| Comparative Example 1 | (A)-1 [100] | (B)-1 [3.5] | (D0)-7 [3.5] | (F)-6 [1.5] | (S)-1 [3200] |
| Comparative Example 2 | (A)-1 [100] | (B)-1 [3.5] | (D0)-4 [3.25] | (F)-6 [1.5] | (S)-1 [3200] |
| Comparative Example 3 | (A)-1 [100] | (B)-1 [3.5] | (D0)-5 [4.54] | (F)-6 [1.5] | (S)-1 [3200] |
| Comparative Example 4 | (A)-1 [100] | (B)-1 [3.5] | (D0)-8 [3.94] | — | (S)-1 [3200] |
| Comparative Example 5 | (A)-1 [100] | (B)-1 [3.5] | (D0)-9 [4.22] | — | (S)-1 [3200] |
| Comparative Example 6 | (A)-1 [100] | (B)-1 [3.5] | (D0)-10 [3.98] | — | (S)-1 [3200] |
| Comparative Example 7 | (A)-1 [100] | (B)-1 [3.5] | (D0)-7 [3.5] | — | (S)-1 [3200] |
| Comparative Example 8 | (A)-1 [100] | (B)-1 [3.5] | (D0)-11 [4.18] | — | (S)-1 [3200] |

In the Tables, the reference characters indicate the following. Further, the values in brackets [ ] indicate the amount (in terms of parts by weight) of the component added.

(A)-1: polymeric compound (A)-1 shown below
(B)-1: compound (B)-1 shown below (D0)-1 to (D0)-11: compounds (D0)-1 to (D0)-11 shown below
(F)-1 to (F)-6: polymeric compounds (F)-1 to (F)-6 shown below
(S)-1: a mixed solvent of PGMEA/PGME/γ-butyrolactone=60/30/10
[Chemical Formula 52]
(A)-1
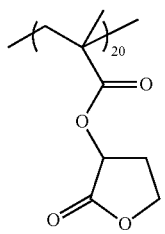
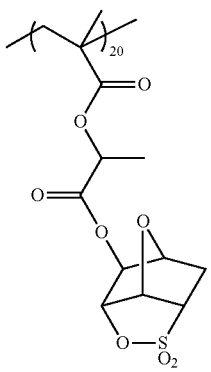
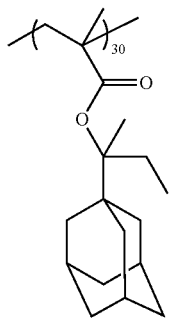
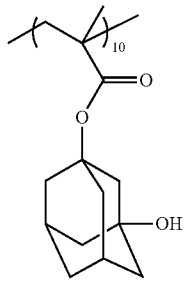
(B)-1
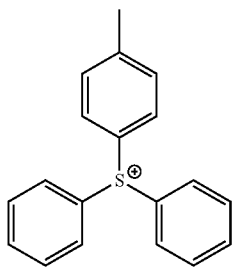
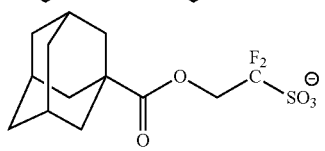
[Chemical Formula 53]
(D0)-3
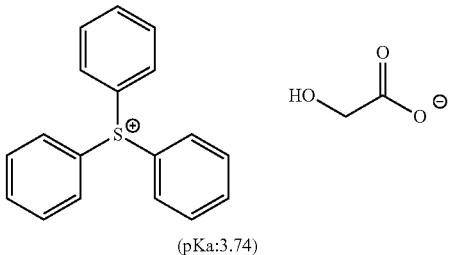
(pKa:3.74)
(D0)-4
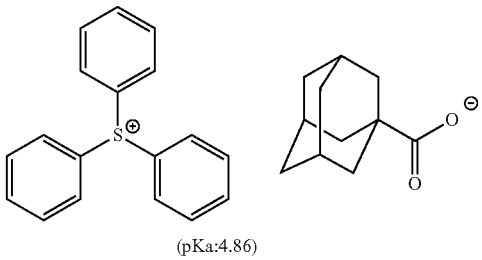
(pKa:4.86)
(D0)-5
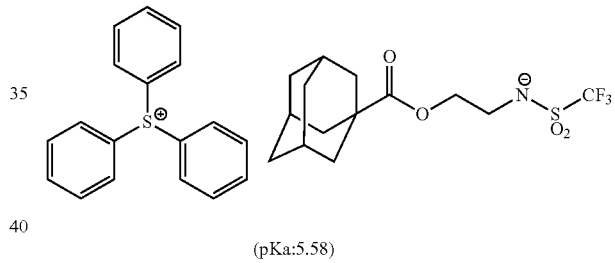
(pKa:5.58)
(D0)-6
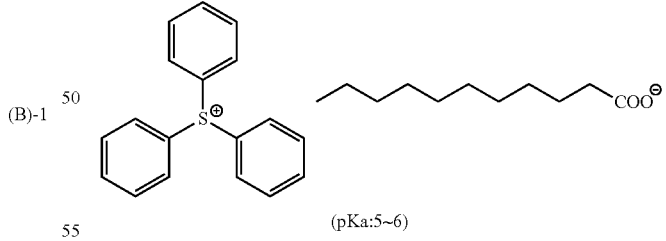
(pKa:5~6)
(D0)-9
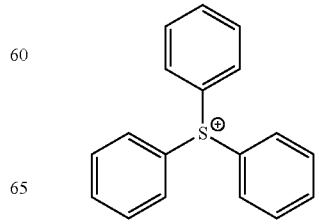

[Chemical Formula 54]
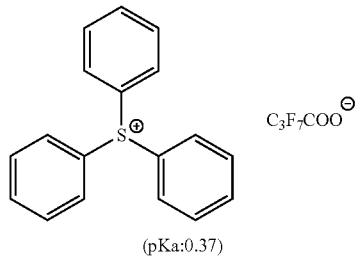
(D0)-7
(pKa:0.37)
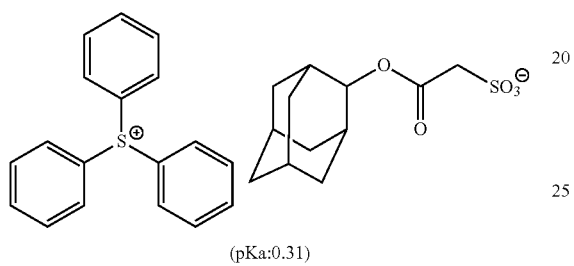
(D0)-8
(pKa:0.31)
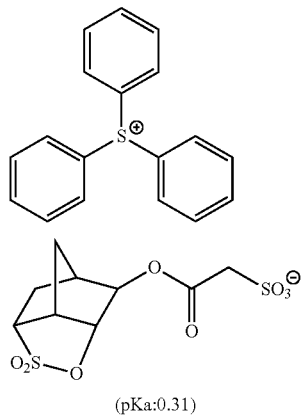
(D0)-9
(pKa:0.31)
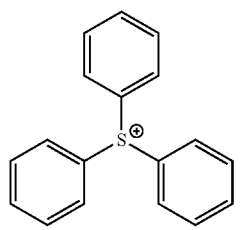
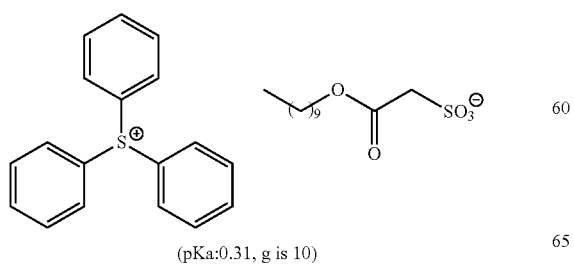
(D0)-10
(pKa:0.31, g is 10)
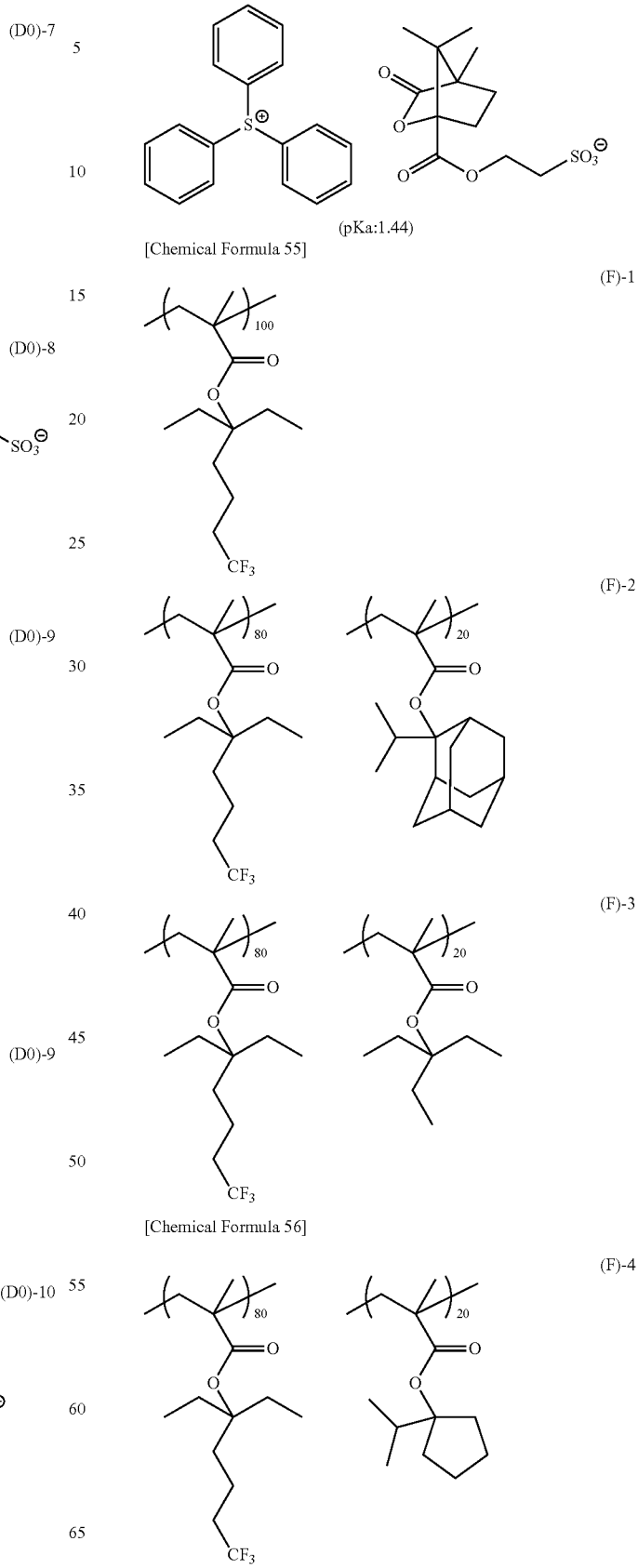
(D0)-11
(pKa:1.44)
[Chemical Formula 55]
(F)-1
(F)-2
(F)-3
[Chemical Formula 56]
(F)-4

-continued

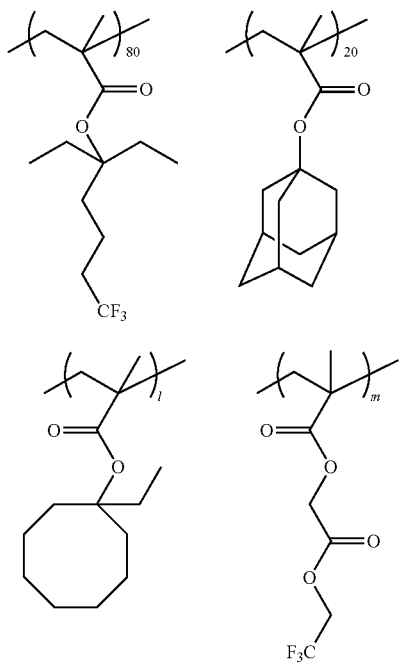

(F)-5

(F)-6

(molar ratio: l/m = 77/23), Mw: 23,100, Mw/Mn: 1.78

Formation of Negative Resist Pattern

Examples 1 to 10, Comparative Examples 1 to 8

An organic anti-reflection film composition (product name: ARC29A, manufactured by Brewer Science Ltd.) was applied to an 12-inch silicon wafer using a spinner, and the composition was then baked at 205° C. for 60 seconds on a hotplate and dried, thereby forming an organic anti-reflection film having a film thickness of 95 nm.

Then, each of the above negative resist compositions indicated in Tables 3 and 4 was applied to the organic antireflection film, and was then prebaked (PAB) on a hotplate at 110° C. for 60 seconds and dried, thereby forming a resist film having a film thickness of 90 nm.

Subsequently, the resist film was selectively irradiated with an ArF excimer laser (193 nm), using an ArF exposure apparatus NSR-S609B (manufactured by Nikon Corporation, NA (numerical aperture)=1.07, ⅔ annular illumination).

Further, PEB treatment was conducted at 90° C. for 60 seconds.

Next, a solvent development was conducted for 13 seconds at 23° C. using butyl acetate, followed by drying by shaking.

As a result, in each of the examples, a contact hole pattern in which holes having a diameter of 55 nm were equally spaced (pitch: 110 nm) was formed (hereafter, this contact hole pattern is referred to as "CH pattern").

[Measurement of Residual Film Ratio]

The film thickness of the CH pattern formed using each of resist compositions in the aforementioned <Formation of negative resist pattern> (i.e., film thickness of exposed portions after solvent development) was determined, and the residual film ratio (unit: %) was determined by the following formulae.

residual film ratio after PEB (%)=(FT2/FT1)×100 residual film ratio after Development (%)=(FT3/FT1)×100 total residual film ratio (%)=(FT4/FT1)×100

In the aforementioned formulae, FT1 indicates the thickness (nm) of the resist film prior to exposure, FT2 indicates the film thickness (nm) of the resist film after PEB, FT3 indicates the film thickness (nm) of the resist film after development, and FT4 indicates the film thickness (nm) of CH patterns.

The film thickness was measured using Nanospec 6100A (manufactured by Nanometrics Incorporated).

The results are shown in Tables 5 and 6.

TABLE 5

| | Residual film ratio after PEB (%) | Residual film ratio after Dev (%) | Total residual film ratio (%) |
| --- | --- | --- | --- |
| Example 1 | 72.7 | 97.47 | 70.86 |
| Example 2 | 72.71 | 100.00 | 72.71 |
| Example 3 | 72.75 | 100.00 | 72.75 |
| Example 4 | 72.77 | 100.00 | 72.77 |
| Example 5 | 73.38 | 100.00 | 73.38 |
| Example 6 | 71.19 | 100.00 | 71.19 |
| Example 7 | 72.67 | 100.00 | 72.67 |
| Example 8 | 72.61 | 100.00 | 72.61 |
| Example 9 | 72.89 | 100.00 | 72.89 |
| Example 10 | 73.02 | 100.00 | 73.02 |

TABLE 6

| | Residual film ratio after PEB (%) | Residual film ratio after Dev (%) | Total residual film ratio (%) |
| --- | --- | --- | --- |
| Comparative Example 1 | 73.05 | 91.31 | 66.70 |
| Comparative Example 2 | 74.17 | 93.60 | 69.42 |
| Comparative Example 3 | 70.21 | 92.48 | 64.93 |
| Comparative Example 4 | 74.25 | 91.87 | 68.21 |
| Comparative Example 5 | 74.11 | 93.48 | 69.28 |
| Comparative Example 6 | 73.72 | 93.46 | 68.90 |
| Comparative Example 7 | 72.90 | 91.40 | 66.63 |
| Comparative Example 8 | 74.30 | 92.91 | 69.03 |

As seen from the results shown above, the negative tone resist composition for solvent developing according to the first aspect of the present invention exhibited excellent film retentiveness of a resist film.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A negative tone resist composition for solvent developing comprising:
   a base component (A) which exhibits decreased solubility in an organic solvent under the action of acid;
   an acid generator component (B) represented by any one of general formulae (b-1) to (b-3) shown below;

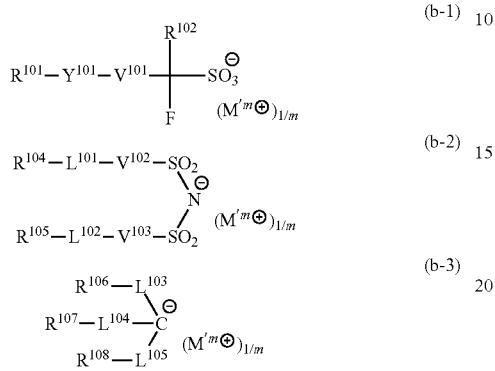

wherein $R^{101}$ and $R^{104}$ to $R^{108}$ each independently represents a cyclic group which may have a substituent, a chain-like alkyl group which may have a substituent or a chain-like alkenyl group which may have a substituent, provided that, $R^{104}$ and $R^{105}$ may be mutually bonded to form a ring; provided that two of $R^{106}$ to $R^{107}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ and $L^{102}$ each independently represents a single bond or an oxygen atom; $L^{103}$ to $L^{105}$ each independently represents a single bond, —CO— or —SO$_2$—; and $M'^{m+}$ represents an organic cation having a valency of m;
   a photodecomposable quencher (D0) which generates acid having a pKa of 3.5 or more represented by general formula (d0-1) shown below:

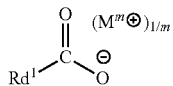

wherein $Rd^1$ represents a chain-like alkyl group which has an alkoxy or a hydroxy substituent, or a chain-like alkenyl group which has an alkyl, an alkoxy or a hydroxy substituent; m represents an integer of 1 or more; and $M^{m+}$ each independently represents an organic cation having a valency of m; and
   a fluorine additive (F) containing a fluorine-containing polymeric compound (f) which has a structural unit (f0-1) represented by general formula (f0-1) shown below;

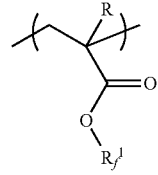

wherein R represents a hydrogen atom, an alkyl group of 1 to 5 carbon atoms or a halogenated alkyl group of 1 to 5 carbon atoms; and $R_f^1$ is a group represented by general formula (f0-r-1) shown below;

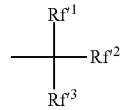

wherein $Rf^1$ represents an alkyl group of 1 to 10 carbon atoms in which at least one hydrogen atom has been substituted with a fluorine atom; and $Rf^2$ and $Rf^3$ each independently represents an alkyl group of 1 to 10 carbon atoms.

2. The negative tone resist composition for solvent developing according to claim 1, wherein the base component (A) comprises a polymeric compound (A1) which comprises a structural unit (a1) containing an acid decomposable group that exhibits increased polarity by the action of acid.

3. The negative tone resist composition for solvent developing according to claim 1, wherein the fluorine-containing polymeric compound (f) further comprises a structural unit (a1) containing an acid decomposable group that exhibits increased polarity by the action of acid.

4. A method of forming a resist pattern, comprising:
   forming a resist film on a substrate using a negative tone resist composition for solvent developing of claim 1;
   conducting exposure of the resist film; and
   developing the resist film using an organic developing solution to form a negative resist pattern.

5. The negative tone resist composition for solvent developing according to claim 1, wherein the photodecomposable quencher (D0) has an anion moiety represented by any one of formulae shown below;

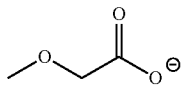 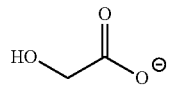

6. The negative tone resist composition for solvent developing according to claim 1, wherein the fluorine-containing polymeric compound (f) is a copolymer.

* * * * *

UNITED STATES PATENT AND TRADEMARK OFFICE
CERTIFICATE OF CORRECTION

PATENT NO. : 9,459,528 B2
APPLICATION NO. : 14/299468
DATED : October 4, 2016
INVENTOR(S) : Tomohiro Oikawa et al.

It is certified that error appears in the above-identified patent and that said Letters Patent is hereby corrected as shown below:

On the Title Page

Line 21 (item (71), Applicant), "Kawasak-shi (JP)" should be --Kawasaki-shi (JP)--.

In the Specification

Column 1, Line 10, after "2013-122142" insert --,--.

Column 9, Line 21, "(a1-r-2)," should be --(a1-r2-2),--.

Column 9, Line 29, "(a1-r-2)," should be --(a1-r2-2),--.

Column 17, Line 63, "[—($CH_2$)—]." should be --[—($CH_2$)$_5$—].--.

Column 19, Line 64, "$n_{a1}$" should be --$n_{a2}$--.

Column 23, Line 56, "[Chemistry" should be --[Chemical--.

Column 27, Line 6, "(a-2-1)" should be --(a2-1)--.

Column 28, Line 27, after "—$S(=O)_2$—O—" insert --.--.

Column 29, Line 66, "(a1-r-1)" should be --(a2-r-1)--.

Column 30, Line 63, "(a1-r-1)" should be --(a2-r-1)--.

Column 31, Line 22, "(a1-r-1)" should be --(a2-r-1)--.

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)

Column 56, Line 51, "$M^{m+}$" should be --$M'^{m+}$--.

Column 58, Line 62, "(f-0-2)" should be --(f0-2)--.

Column 63, Line 66, "(f-0-1)" should be --(f0-1)--.

Column 64, Line 34, "(I)" should be --(f)--.

Column 69, Line 47, "[—$CH_2CH_2$];" should be --[—$CH_2CH_2$—];--.

Column 70, Line 6, "$V'^{101}$" should be --$V^{101}$--.

Column 70, Line 16, "(b-1)," should be --(b-1).--.

Column 72, Line 57, "biphenylthio" should be --biphenylthiol--.

Column 73, Line 46, after "—$SO_2$—," insert -- —$SO_3$—,--.

Column 97, Line 66:

After "

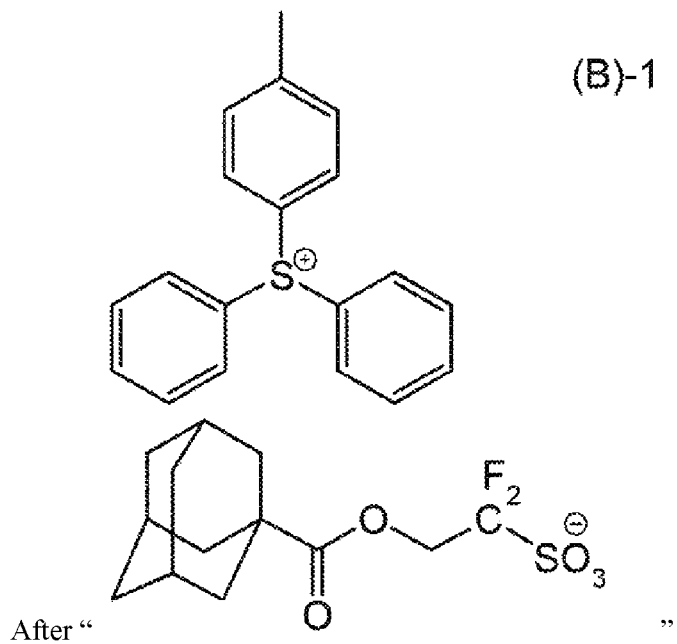

"

CERTIFICATE OF CORRECTION (continued)
U.S. Pat. No. 9,459,528 B2

Insert -- 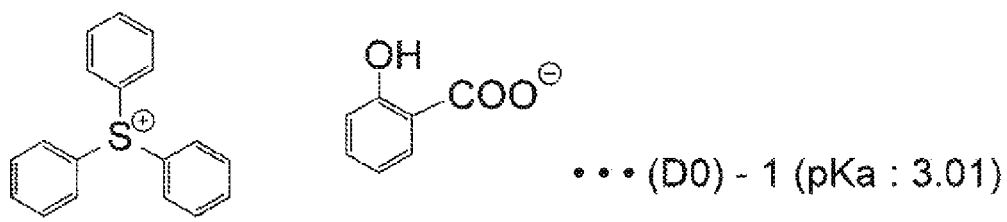 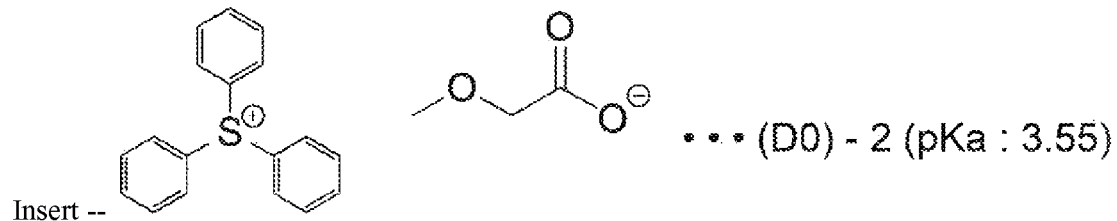 --.

Column 98, Lines 55-65:

After " 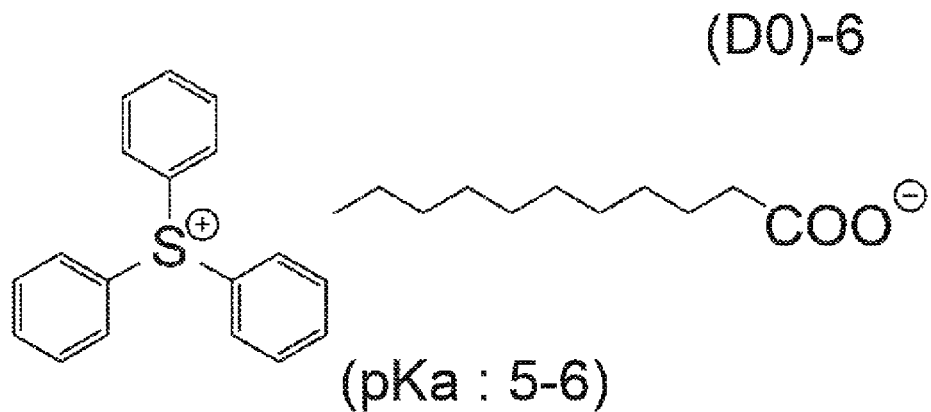 "

Delete " 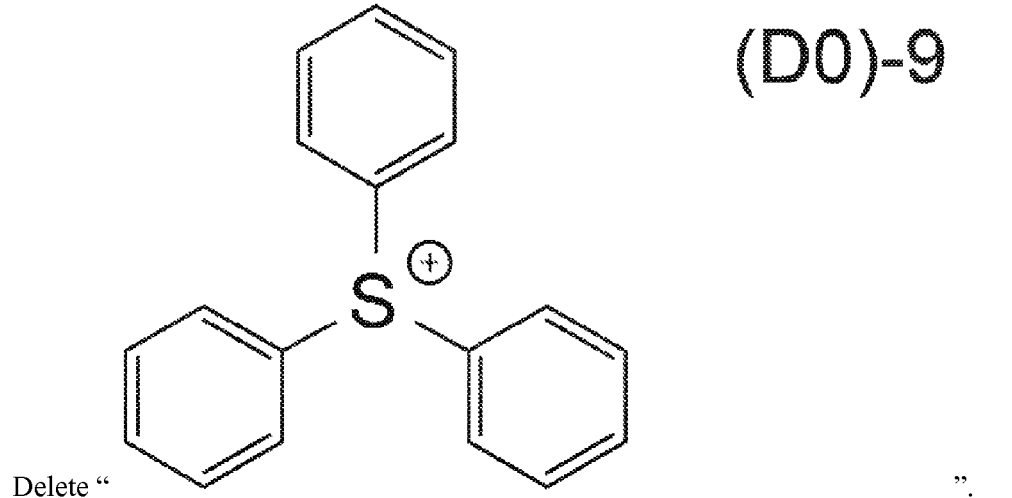 ".

CERTIFICATE OF CORRECTION (continued)
U.S. Pat. No. 9,459,528 B2

In the Claims

Column 103, Line 30 (Claim 1), after "that" insert --,--.

Column 104, Line 55 (Claim 5), after " 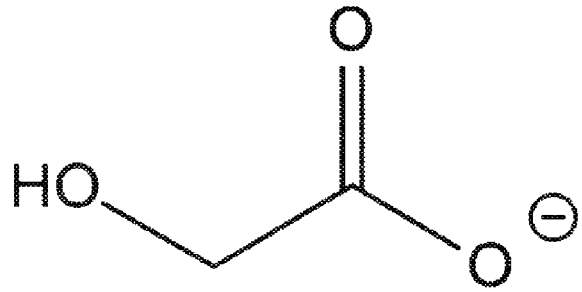 " insert --.--.